US009735306B2

(12) United States Patent  
Carter et al.

(10) Patent No.: US 9,735,306 B2  
(45) Date of Patent: Aug. 15, 2017

(54) WÜSTITE-BASED PHOTOELECTRODES WITH LITHIUM, HYDROGEN, SODIUM, MAGNESIUM, MANGANESE, ZINC AND NICKEL ADDITIVES

(71) Applicants: Emily Ann Carter, Belle Mead, NJ (US); Maytal Caspary Toroker, Princeton, NJ (US)

(72) Inventors: Emily Ann Carter, Belle Mead, NJ (US); Maytal Caspary Toroker, Princeton, NJ (US)

(73) Assignees: THE TRUSTEES OF PRINCETON UNIVERSITY, Princeton, NJ (US); TECHNION RESEARCH & DEVELOPMENT FOUNDATION, LTD, Haifa (IL)

(*) Notice: Subject to any disclaimer, the term of this patent is extended or adjusted under 35 U.S.C. 154(b) by 542 days.

(21) Appl. No.: 13/899,049

(22) Filed: May 21, 2013

(65) Prior Publication Data

US 2014/0130853 A1    May 15, 2014

Related U.S. Application Data

(60) Provisional application No. 61/649,601, filed on May 21, 2012, provisional application No. 61/730,384, filed on Nov. 27, 2012, provisional application No. 61/730,388, filed on Nov. 27, 2012.

(51) Int. Cl.
| | |
|---|---|
| *H01L 31/00* | (2006.01) |
| *H01L 31/18* | (2006.01) |
| *H01L 31/0264* | (2006.01) |
| *H01L 31/032* | (2006.01) |
| *H01L 31/07* | (2012.01) |
| *H01L 31/072* | (2012.01) |

(52) U.S. Cl.
CPC .......... *H01L 31/18* (2013.01); *H01L 31/0264* (2013.01); *H01L 31/032* (2013.01); *H01L 31/07* (2013.01); *H01L 31/072* (2013.01); *Y02E 10/50* (2013.01)

(58) Field of Classification Search
CPC .......................... H01L 31/032; H01L 31/0264
USPC ................................................. 136/243–265
See application file for complete search history.

(56) References Cited

U.S. PATENT DOCUMENTS

| 4,927,721 A | * | 5/1990 | Gratzel | ................ | H01G 9/2031 |
|---|---|---|---|---|---|
| | | | | | 429/111 |
| 2002/0064498 A1 | * | 5/2002 | Tabuchi | ............... | C01G 45/125 |
| | | | | | 423/594.2 |
| 2004/0016455 A1 | * | 1/2004 | Oogami | ................. | H01M 2/02 |
| | | | | | 136/244 |

OTHER PUBLICATIONS

Toroker et al., (Hole Transport in Nonstoichiometric and Doped Wustite), The Journal of Physical Chemistry.*

(Continued)

*Primary Examiner* — Jeffrey T Barton  
*Assistant Examiner* — Niki Bakhtiari  
(74) *Attorney, Agent, or Firm* — Meagher Emanuel Laks Goldberg & Liao, LLP

(57) ABSTRACT

A photoelectrode, photovoltaic device and photoelectrochemical cell and methods of making are disclosed. The photoelectrode includes an electrode at least partially formed of FeO combined with at least one of lithium, hydrogen, sodium, magnesium, manganese, zinc, and nickel. The electrode may be doped with at least one of lithium, hydrogen, and sodium. The electrode may be alloyed with at least one of magnesium, manganese, zinc, and nickel.

8 Claims, 16 Drawing Sheets

(56) References Cited

OTHER PUBLICATIONS

Schlogl, R., "The Role of Chemistry in the Energy Challenge", ChemSusChem 3, 2010.
Maeda, K.; Domen, K., "Photocatalytic Water Splitting: Recent Progress and Future Challenges", The Journal of Physical Chemistry Letters, 1, Aug. 2010.
Blankenship, R. E.; Tiede, D. M.; Barber, J.; Brudvig, G. W.; Fleming, G.; Ghirardi, M.; Gunner, M. R.; Junge, W.; Kramer, D. M.; Melis, A., et al., "Comparing Photosynthetic and Photovoltaic Efficiencies", Science. 805-809, May 2011.
Ennaoui, A.; Fiechter, S.; Pettenkofer, C.; Alonso-Vante, N.; Buker, K.; Bronold, M.; Hopfner, C.; Tributsch, H., "Iron disulfide for solar energy conversion", Solar Energy Materials and Solar Cells, 29, 1993.
Caban-Acevedo, M.; Faber, M. S.; Tan, Y.; Hamers, R. J.; Jin, S., "Synthesis and Properties of Semiconducting Iron Pyrite", Nano Letters, 12, Mar. 2012.
Balberg, I.; Pinch, H. L. J., "The optical absorption of iron oxides", Magn. Magn. Mater. 7,12-15, 1978.
Bowen, H. K.; Adler, D.; Auker, B. H., "Electrical and optical properties of FeO", J Solid State Chem., 12, 1975.
Murphy, A. B.; Barnes, P. R. F.; Randeniya, L. K.; Plumb, I. C.; Grey, I. E.; Home, M.D.; Glasscock, J. A., "Efficiency of solar water splitting using semiconductor electrodes", Int. J of Hydrogen Energy, 31, Mar. 2006.
Shockley, W.; Queisser, H. J., "Detailed Balance Limit of Efficiency of p n Junction Solar Cells", J Appl. Phys., 32, Oct. 1961.
Caspary Toroker, M.; Kanan, D. D.; Alidoust, N.; Isseroff, L. Y.; Liao, P.; Carter, E. A., "First principles scheme to evaluate band edge positions", Phys. Chem. Chem. Phys.,13, Jul. 2011.
Darken, L. S.; Gurry, R. W., "The System Iron Oxygen. I. The Wüstite Field and Related Equilibria", J. Am. Chem. Soc., 67, Aug. 1945.
Galloway, H. C.; Benitez, J. J.; Salmeron, M., "The structure of monolayer films of FeO on Pt(111)", Surf. Science., 298, Jul. 1993.
Wang, W.; Zhang, H.; Wang, W.; Zhao, A.; Wang, B.; Huo, J. G., "Observation of water dissociation on nanometer sized FeO islands grown on Pt(1 1 1)", Chem. Phys. Lett., 500, Sep. 2010.
Morrish, R.; Rahman, M.; MacElroy, J. M. D.; Wolden, C. A., "Activation of Hematite Nanorod Arrays for Photoelectrochemical Water Splitting", ChemSusChem, 4, 2011.
Kanan, D. K.; Carter, E. A., "Band Gap Engineering of MnO via ZnO Alloying", The Journal of Physical Chemistry C, 116, Apr. 2012.
Bosman, A. J.; Van Daal, H. J., "Small polaron versus band conduction in some transition metal oxides", Advances in Physics, 19, 1970.
Bransky, I.; Tannhauser, D. S., "Mobility of charge carriers in Wüstite", Physica, 37, 1967.
Gartstein, E.; Mason, T. 0., "Reanalysis of Wustite Electrical Properties", Communications of the American Ceramic Society, C-24-C-26, Feb. 1982.
Frohlich, H., "Electrons in lattice fields", Advances in Physics, 3, 1954.
Austin, I. G.; Mott, N. F., "Polarons in crystalline and non crystalline materials", Adv. Phys., 18, 1969.
Liao, P.; Caspary Toroker, M.; Carter, E. A., "Electron Transport in Pure and Doped Hematite", Nano Lett., 11, Mar. 2011.
Marcus, R. A., "Electron transfer reactions in chemistry. Theory and experiment", Rev. Mod. Phys., 65, Jul. 1993.
McCammon, C. A.; Liu, L., "The effects of pressure and temperature on nonstoichiometric wüstite, FexO", Phys. Chem. Miner., 10, 1984.
Kanan, D. K.; Sharifzadeh, S.; Carter, E. A., "Quantum mechanical modeling of electronic excitations in metal oxides", Chem. Phys. Lett., 519, Nov. 2012.
Hay, P. J.; Wadt, W. R., "Ab initio effective core potentials for molecular calculations", J Chem. Phys., 82, Sep. 1985.
Evjen, H. M., "On the Stability of Certain Heteropolar Crystals", Phys. Rev., 39, Feb. 1932.
Hurley, M. M.; Pacios, L. F.; Christiansen, P. A.; Ross, R. B.; Ermler, W. C., "Ab initio relativistic effective potentials with spin orbit operators", J Chem. Phys., 84, Mar. 1986.
Bergner, A.; Dolg, M.; Kuechle, W.; Stoll, H.; Preuss, H., "Ab initio energy adjusted pseudopotentials for elements", Mol. Phys., 80, Apr. 1993.
Hehre, W. J.; Ditchfield, R.; Pople, J. A., "Self Consistent Molecular Orbital Methods. XII.", J Chem. Phys., 56, Mar. 1972.
Krishnan, R.; Binkley, J. S.; Seeger, R.; Pople, J. A., "Self consistent molecular orbital methods. XX.", J Chem. Phys., 72, Apr. 1980.
McLean, A. D.; Chandler, G. S., "Contracted Gaussian basis sets for molecular calculations. I.", The Journal of Chemical Physics, 72, Jan. 1980.
Hay, P. J.; Wadt, W. R., "Ab initio effective core potentials for molecular calculations.", J Chem. Phys., 82, Sep. 1984.
Nakau, T., "Electrical Conductivity", J Phys. Soc. Jpn., 15, Jan. 1960.
Iordanova, N.; Dupuis, M.; Rosso, K. M., "Charge transport in metal oxides", J Chem. Phys., 122, Jan. 2005.
Schmidt, M. W.; Baldridge, K. K.; Boatz, J. A.; Elbert, S. T.; Gordon, M. S.; Jensen, J. H.; Koseki, S.; Matsunaga, N.; Nguyen, K. A.; Su, S., et al., "General Atomic and Molecular Electronic Structure System", J. Comput. Chem., 14, May 1993.
Becke, A. D., "Density functional thermochemistry. III. The role of exact exchange", J Chem. Phys., 98, 1993.
Farazdel, A.; Dupuis, M.; Clementi, E.; Aviram, A., "Electric Field Induced Intramolecular Electron Transfer in Spiro—Electron Systems and Their Suitability as Molecular Electronic Devices. A Theoretical Study", J. Am. Chem. Soc., 112, 1990.
Kerisita, S., Rosso, K., "Charge transfer in FeO: A combined molecular-dynamics and ab initio study" The Journal of Chemical Physics, 123, 224712, Dec. 2005.
Rosso, K., Smith, D., Dupuis, M., "An ab initio model of electron transport in hematite •alpha-Fe2O3) basal planes", Journal of Chemical Physics, vol. 118, 14, Apr. 2003.
Hodge, J.D.; Bowen, H. K., "High-Temperature Thermoelectric Power Measurements in Wustite", J Amer. Ceram. Soc., 64, Aug. 1981.
Dai, W.; Seetharaman, S.; Staffansson, L. I., "Phase-Relationships in the System Fe—Na—O", Metall. Trans. B., 15B, Jun. 1984.
Gavartin, J. L.; Shluger, A. L.; Catlow, C. R. A., "Modelling of the impurity-vacancy interaction in magnesium doped lithium oxide", J Phys.: Condens. Matter, 5, Jul. 1993.
Bode, B. M.; Gordon, M.S., "MacMolPlt: A graphical user interface for GAMESS", J Mol. Graphics and Modeling, 16, Jun. 1998.

* cited by examiner

| Hopping Direction | [FeCuO₁₀]⁻¹⁶ (Figure 4a) | | [Fe₃CuO₁₈]⁻²⁸ (Figure 4b) | | [FeLiO₁₀]⁻¹⁶ (Figure 4c) | | [Fe₃LiO₁₈]⁻²⁸ (Figure 4d) | | [FeNaO₁₀]⁻¹⁶ (Figure 4e) | | [Fe₃NaO₁₈]⁻²⁸ (Figure 4f) | |
|---|---|---|---|---|---|---|---|---|---|---|---|---|
| | Fe→Cu | Cu→Fe | Fe1→Fe2 | Fe2→Fe1 | Fe1→O2 | O2→Fe1 | Fe1→Fe2 | Fe2→Fe1 | Fe1→O2 | O2→Fe1 | Fe1→Fe2 | Fe2→Fe1 |
| Activation energy, ΔG* [eV] | 0.10 | 1.59 | 0.20 | 0.98 | 2.34 | 0.07 | 0.19 | 1.00 | 2.58 | 0.10 | 0.26 | 0.90 |
| Reorganization energy, $E_\lambda$ [eV] | 2.34 | 2.21 | 2.07 | 2.05 | 1.92 | 1.75 | 2.02 | 2.06 | 1.75 | 1.71 | 2.14 | 2.10 |
| Free energy, ΔG [eV] | -1.50 | | -0.78 | | 2.27 | | -0.81 | | 2.48 | | -0.64 | |

FIG. 5

| Hopping Direction | [Fe₂HO₁₀]⁻¹⁴ (Figure 5a) | [Fe₄HO₁₈]⁻²⁶ (Figure 5b) | | [Fe₃HO₁₈]⁻²⁸ (Figure 5c) | |
|---|---|---|---|---|---|
| | Fe1→Fe2 | Fe2→Fe4 | Fe4→Fe2 | Fe2→Fe4 | Fe4→Fe2 |
| Activation energy, ΔG* [eV] | 0.67 | 0.20 | 1.02 | 0.79 | 0.35 |
| Reorganization energy, $E_\lambda$ [eV] | 2.55 | 1.86 | 2.05 | 2.13 | 2.19 |
| Free energy, ΔG [eV] | 0 | -0.83 | | 0.44 | |

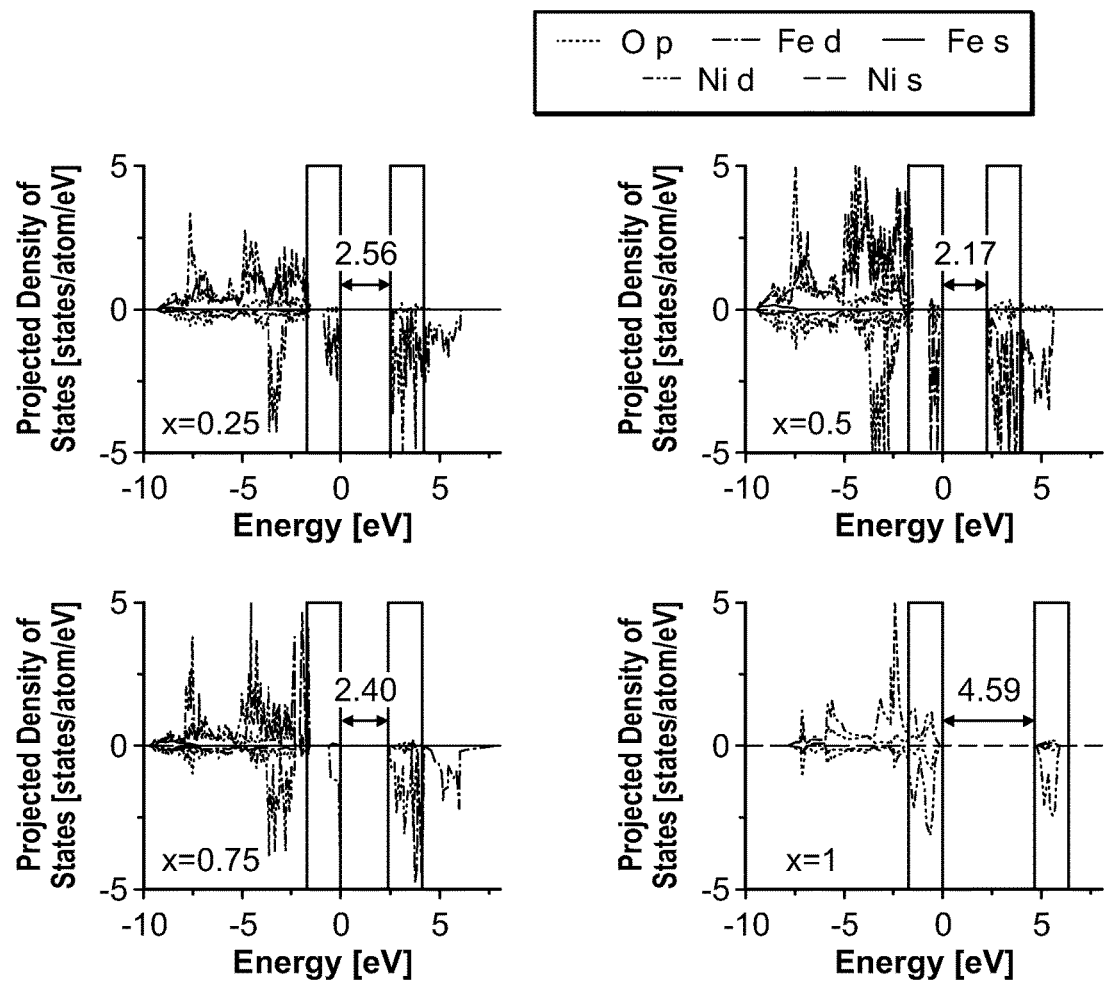
FIG. 9(c)

$Fe_{1-x}Zn_xO$

WÜSTITE-BASED PHOTOELECTRODES WITH LITHIUM, HYDROGEN, SODIUM, MAGNESIUM, MANGANESE, ZINC AND NICKEL ADDITIVES

CROSS-REFERENCE TO PRIOR FILED APPLICATIONS

This application claims priority to U.S. provisional application 61/649,601 filed on May 21, 2012, U.S. provisional application 61/730,384 and U.S. provisional application 61/730,388, both filed Nov. 27, 2012 which are incorporated herein in their entirety.

UNITED STATES GOVERNMENT RIGHTS

This invention was made with government support under Grant #DE-SC0002120 awarded by the Department of Energy BES and Grant #FA9550-1 0-1-0162 awarded by the Air Force Office of Scientific Research. The government has certain rights in this invention.

FIELD OF INVENTION

The present invention relates to photoelectrodes. More particularly, it relates wüstite-based photoelectrodes with improved conductivity, band gap and band edge characteristics.

BACKGROUND

Wüstite is a transition metal oxide (that is, iron (II) oxide) that carries several advantages, including being cheap, non-toxic, and has a band gap in the optimal range for absorbing solar energy. One disadvantage of wüstite is that it suffers from thermodynamic instability in the bulk phase, but can alternatively be used in the nanophase (wüstite has been observed as a nano-film and as nanometer-sized islands. References: Galloway, H C., Benitez, J. J., and Salmeron, M. Surf. Science 1993, 298, 127; Wang, W., Zhang, H., Wang, W., Zhao, A., Wang, B., and Huo, J. G. Chem. Phys. Lett. 2010, 500, 76), or as an alloy with other stable oxides. The low conductivity of wüstite is another major disadvantage that limits its capability to transport charge carriers after photon absorption, toward producing electricity or fuel. Wüstite also has conduction and valence band edges with the same orbital character that may lead to unfavorably high electron-hole recombination rates. Another limitation of iron (II) oxide is that the calculated valence band edge is not positioned well for oxidizing water. Furthermore, unlike wüstite, other oxides, including magnesium (II) oxide, manganese (II) oxide, nickel (II) oxide, and zinc (II) oxide, have band gaps that are too large for efficiently absorbing light. It would be desirable to provide improved wüstite compositions that address these and other shortcomings.

SUMMARY OF THE INVENTION

A photoelectrode is disclosed. The photoelectrode includes an electrode at least partially formed of FeO combined with at least one of lithium, hydrogen, sodium, magnesium, manganese, zinc, and nickel. The electrode may be doped with at least one of lithium, hydrogen, and sodium. The electrode may be alloyed with at least one of magnesium, manganese, zinc, and nickel. The electrode may be doped with hydrogen at any concentration, lithium at up to at least 0.45 metal fraction of lithium, and sodium at up to 0.25 metal fraction of sodium. The electrode may be alloyed with magnesium (II) oxide, manganese (II) oxide, zinc (II) oxide, or nickel (II) oxide at any concentration between 0% to 100%, particularly at 25%, 50%, or 75% concentration. The lithium, hydrogen and sodium dopants may be configured such that the dopant(s) will not trap holes.

A photovoltaic device is also disclosed. The photovoltaic device includes a p-type semiconductor comprised of FeO combined with at least one of lithium, hydrogen, sodium, magnesium, manganese, zinc, and nickel. The photovoltaic device also includes an n-type semiconductor coupled to the p-type semiconductor forming a p-n junction. The p-type semiconductor may be doped with at least one of lithium, hydrogen, and sodium. The p-type semiconductor may be alloyed with at least one of magnesium, manganese, zinc, and nickel. The lithium, hydrogen and sodium dopants may be configured such that the dopant(s) will not trap holes. The photovoltaic device may also include a load electrically coupled to the p-type and n-type semiconductors.

A photoelectrochemical cell is also disclosed. The photoelectrochemical cell may be configured for electrolysis of water and includes a first photoelectrode comprised of FeO combined with at least one of lithium, hydrogen, sodium, zinc, and nickel, the electrode being configured for immersion in the water. The photoelectrochemical cell also includes a second electrically coupled to the first electrode, the second electrode being configured for immersion in the water. The first electrode may be doped with at least one of lithium, hydrogen and sodium. The first electrode may be alloyed with at least one of magnesium, manganese, zinc and nickel. The lithium, hydrogen and sodium dopants may be configured such that the dopant(s) will not trap holes. The photovoltaic cell may include a voltage source electrically coupled between the two semiconductors.

A method of making a photovoltaic device is also disclosed. The method includes providing a p-type semiconductor at least partially formed FeO and combining at least one of lithium, hydrogen, sodium, magnesium, manganese, zinc and nickel with the p-type semiconductor. The method also includes providing an n-type semiconductor; and forming a p-n junction between the p-type semiconductor and n-type semiconductor. The p-type semiconductor may be doped with at least one of lithium, hydrogen and sodium. The p-type semiconductor may be alloyed with at least one of magnesium, manganese, zinc and nickel. The lithium, hydrogen and sodium dopants may be configured such that the dopant(s) will not trap holes.

A method of making a photoelectrode is also disclosed. The method includes providing an electrode at least partially formed FeO and combining at least one of lithium, hydrogen, sodium, magnesium, manganese, zinc and nickel with the electrode. The photoelectrode may be doped with at least one of lithium, hydrogen and sodium. The photoelectrode may be alloyed with at least one of magnesium, manganese, zinc and nickel. The lithium, hydrogen and sodium dopants may be configured such that the dopant(s) will not trap holes. The photoelectrode and a second electrode may be surrounded with an aqueous solution, the photoelectrode being configured to emit electrons upon light absorption and the second electrode being configured to generate holes.

BRIEF DESCRIPTION OF THE FIGURES

FIG. 1 includes several structure diagrams of wüstite (FeO) embedded clusters;

FIG. 5 is a table showing hole transfer activation, reorganization, and free energies in copper-, lithium- and sodium-doped wüstite. Corresponding potential energy curves and clusters are shown in FIG. 3;

FIG. 6 is a table showing hole transfer activation, reorganization, and free energies in hydrogen-doped wüstite. Corresponding potential energy curves and clusters are shown in FIG. 4.

DETAILED DESCRIPTION OF THE INVENTION

Figure 1A:
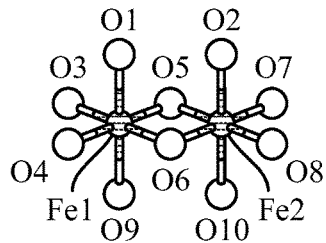
FIG. 1a shows an $[Fe_2O_{10}]^{-15}$ cluster without a vacancy but with an added hole.
Figure 1C:
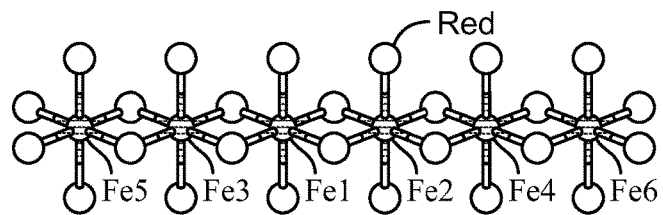
FIG. 1c shows an $[Fe_6O_{24}]^{-35}$ cluster without a vacancy but with an added hole.
Figure 1B:
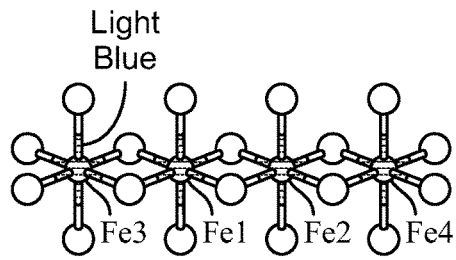
FIG. 1b shows an $[Fe_4O_{18}]^{-27}$ cluster without a vacancy but with an added hole.
Figure 1F:
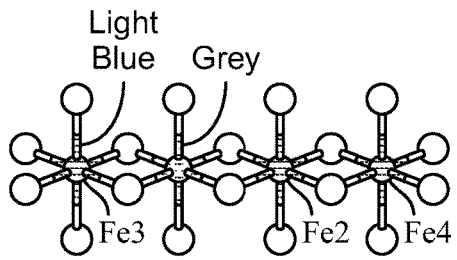
FIG. 1f shows an $[Fe_3O_{18}]^{-28}$ cluster with a vacancy present instead of a cation at the Fe1 site and with two holes added to the iron cations Fe2 and Fe3.
Figure 1D:
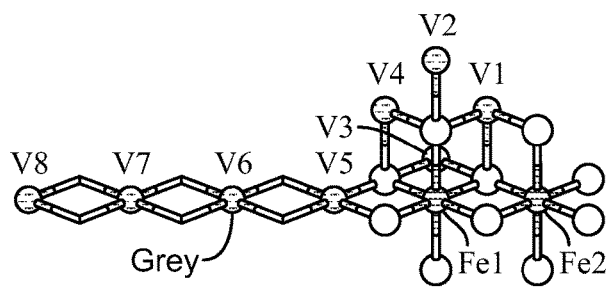
FIG. 1d shows an $[Fe_2O_{10}]^{-15}$ cluster with one added hole and a vacancy present in one of sites V1 through V8.
Figure 1E:
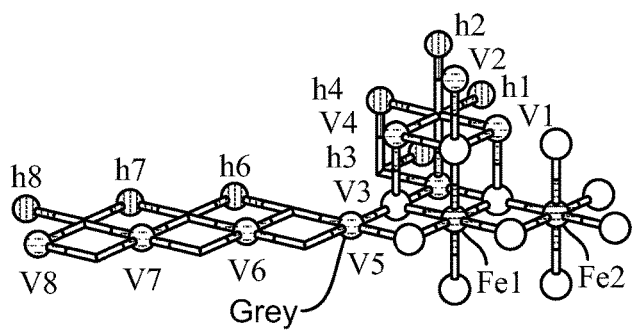
FIG. 1e also shows an $[Fe_2O_{10}]^{-15}$ cluster as in FIG. 1d but with a second hole present at one of sites h1-h4 and h6-h8.

As explained above, one disadvantage of wüstite is that it suffers from thermodynamic instability in the bulk phase. The low conductivity of wüstite is another major disadvantage that limits its capability to transport charge carriers after photon absorption, toward producing electricity or fuel. Perceived limitations of wüstite can be ameliorated by nanostructuring and using the doping techniques disclosed herein. The disclosed materials overcome a limitation that appears in the parent materials, i.e., low conductivity. The disclosed doping techniques amplify conductivity by increasing the number of charge carriers, while not acting as a charge trapping site.

Immediate applications include using these materials as semiconductors in photovoltaic s, as electrodes in photoelectrochemical cells, and as photocatalysts, for electricity and fuel production. Sodium, lithium, and hydrogen may be effective for other transition metal oxides that do not contain wüstite, since sodium will surely not act as a trapping site in other materials as well.

Materials containing wüstite have not been used to date in solar energy conversion devices that are constructed in accordance with the disclosure herein. Conventional semiconductors used in the solar industry such as crystalline silicon require an expensive purification process to obtain pure and defect-free materials. Transition metal oxides are much more affordable, because of their abundance, ease of synthesis, and low cost (in energy and dollars) of manufacturing at large scale. Transition metal oxides are particularly cheap when they include wüstite (that is, contain iron (II) oxide via doping, alloying or other combined architecture), because iron is one of the ten most abundant natural elements. Wüstite offers additional benefits when it is doped with sodium, lithium, or hydrogen. These dopants will enhance wüstite's conductivity, and unlike many other dopants, will not be a trapping site for charge carriers. Additional disclosure is contained in M. Caspary Toroker and E. A. Carter, "Hole transport in non-stoichiometric and doped wustite", J. Phys. Chem. C 116, 17403 (2012), which is incorporated herein in its entirety. All references to publications recited herein are also incorporated herein in their entirety.

The disclosed materials may be used as a solar cell or photocatalyst or photocatalytic electrode that costs less than existing technologies. If a semiconductors containing wüstite are used in these devices, then doping with sodium, lithium, or hydrogen may improve their functionality.

Increasing the iron vacancy concentration or adding p-type dopants improves FeO conductivity by increasing the number of holes. A small polaron model is used along with ab initio calculations on electrostatically embedded clusters to analyze the local trapping effects of iron vacancies and several substitutional p-type dopants that are soluble in FeO, including copper, nitrogen, lithium, and sodium, and also hydrogen as an interstitial dopant for comparison. It has been determined that vacancies create stronger traps than dopants and that copper and nitrogen dopants form deeper traps than lithium, sodium, or hydrogen. It has also been determined that hydrogen repels the hole and substantially decreases the trap formed by an iron vacancy. Because of the shallower traps formed compared to vacancies, lithium-, sodium-, or hydrogen-doped, nanostructured or alloyed FeO may be a good candidate for a p-type semiconductor for solar energy conversion applications.

Low cost synthesis and processing is a major incentive for considering semiconducting metal oxides. As disclosed above, wüstite (i.e., iron (II) oxide, FeO) is a particularly inexpensive metal oxide, a corrosion product of iron (one of the ten most abundant elements). Given that iron sulfides serve as efficient electron transfer agents in biological systems, analogous iron compounds may be exploitable in solar cells. This disclosure considers oxides rather than sulfides due to cost and service lifetime considerations (oxides are less likely than sulfides to corrode). Another advantage of FeO is that it has an optical band gap in the visible range of the solar spectrum ($E_{gap}$=2.4 eV), which is not too far from the estimated ideal band gap for, e.g., water splitting photocatalysis (~2.0 eV). A small absorption peak has also been detected near 1.3 eV, which is not far from the ideal band gap of ~1.5 eV for efficient solar energy conversion in photovoltaics, enabling absorption of light in the visible (highest intensity) region of the solar spectrum. Finally, the calculated conduction band minimum of FeO is positioned above the free energy required for producing several fuels, and therefore FeO could possibly be used as a photocatalyst for reducing water or carbon dioxide.

As explained above, FeO has two major problems. The first is that at room temperature the bulk phase of FeO is thermodynamically unstable. The existence of FeO at the nanoscale is controversial. Some argue that FeO does not exist at any temperature on the nanoscale. However, FeO in its bulk rocksalt structure has been observed at room temperature as a nano-film and as nanometer-sized islands. These findings suggest that FeO might be stable in a nanowire array configuration that would be optimum for light absorption and charge separation. Moreover, alloying may stabilize FeO (as well as improve its key solar energy conversion properties). Hence, fabricating FeO as a nanostructure or alloy may resolve this first problem.

As explained above, FeO has two major problems. The first is that at room temperature the bulk phase of FeO is thermodynamically unstable. The existence of FeO at the nanoscale is controversial. Some argue that FeO does not exist at any temperature on the nanoscale. However, FeO in its bulk rocksalt structure has been observed at room temperature as a nano-film and as nanometer-sized islands. These findings suggest that FeO might be stable in a nanowire array configuration that would be optimum for light absorption and charge separation. Moreover, alloying may stabilize FeO (as well as improve its key solar energy conversion properties). Hence, fabricating FeO as a nanostructure or alloy may resolve this first problem.

A second problem that limits the functionality of FeO and many other metal oxides is low conductivity, due to ionic lattice distortions that electrostatically interact with charge carriers. A large number of hole carriers are present in FeO from an unusually large number of iron vacancies (as high as 16%). FeO is therefore naturally p-type, i.e., the majority of carriers are holes. The hole conductivity σ of FeO is strongly affected by its low intrinsic mobility, $$\sigma = ne\mu \quad (1)$$

Where n is the hole concentration, є is the charge of a hole, and μ is the hole mobility. Indeed, the measured hole mobility of FeO at 1000° C. is about three orders of magnitude lower than the hole mobility of GaAs at room temperature. The hole mobility of FeO is inhibited by an exponential dependence given by:

$$\mu \propto e^{-E_a/k_BT} \quad (2)$$

The exponential behavior with temperature usually observed in conductivity experiments on transition metal oxides is generally interpreted as indicative of charge transport of a polaron quasiparticle with activation energy $E_a$ ($k_B$ is the Boltzmann constant, T denotes the temperature, and $E_a$=0.16 eV[26] at 900-1300° C. for hole conductivity in FeO).

Charge transport of a polaron is especially slow since charge moves together with lattice distortions of interacting ionic nuclei.

It has been shown experimentally that the hole conductivity of FeO can be improved by increasing the hole concentration via adding p-type dopants or iron vacancies. Increasing iron vacancies from 5% to 11% elevates hole conductivity at 1300° C. by ~80%. Alternatively, doping FeO with p-type dopants (which donate holes), such as 0.1 at. % copper, increases hole conductivity at 1300° C. by ~8% (compared to undoped FeO with 5% vacancies). Doping FeO with n-type dopants (which donate electrons), such as chromium or titanium, is not productive as it decreases the number of holes and therefore decreases hole conductivity.

Both iron vacancies and p-type dopants enhance hole conductivity by increasing the hole concentration, which at the low temperature limit ($k_BT \ll E_A$) is given by:

$$n \propto \sqrt{N_A} e^{-E_A/2k_BT}, \quad (3)$$

Where $N_A$ is the number of "acceptor" states (orbitals that have energies above the Fermi level and that may donate holes to the valence band) and $E_A$ is the energy of the acceptor state relative to the valence band edge. Although both p-type dopants and iron vacancies increase the concentration $N_A$ of orbitals that contain holes, the energy $E_A$ needed to extract a hole from an orbital is sensitive to whether iron vacancies or p-type dopants are present, and to the elemental identity of the dopant. A large $E_A$ is not desired, because then holes are trapped, the concentration of mobile holes decreases, and hole conductivity is low.

The disclosure herein determines whether iron vacancies or p-type dopants introduce larger energy traps $E_A$ that would suppress the hole conductivity of FeO. In addition, the disclosure herein compares the effect of the disclosed dopants, namely nitrogen, copper, lithium, sodium, and hydrogen, on the hole conductivity of FeO.

Disclosed herein is ab initio quantum chemistry and the small polaron model to compare the effect of iron vacancies and dopants on the hole conductivity of FeO. In particular, electrostatically-embedded cluster models are used to compare the local trapping energies of iron vacancies and dopants. This work builds on previous work where titanium dopants were found to create larger energy traps than zirconium, silicon, and germanium dopants for electron transport in hematite ($Fe_2O_3$). It will be demonstrated that vacancies create larger energy traps for holes than dopants do, and that nitrogen and copper create larger energy traps than lithium, sodium, and hydrogen in FeO.

U.S. provisional application 61/649,601 filed on May 21, 2012, which is incorporated herein in its entirety includes computational details regarding the electrostatically-embedded clusters used for calculating Marcus theory parameters, including the free energy for hole transfer between sites, which is associated with the trapping energy.

p-type Doped FeO

In this section several dopants are compared, ultimately concluding that lithium, sodium, and hydrogen are the most promising dopants to improve the conductivity of FeO. The rationale for selecting various dopants is outlined. Then for each dopant, the free energy change is predicted for both hole transfer from an iron cation to a dopant and hole transfer between iron cations located near a dopant. Then hole transfer near an interstitial n-type hydrogen dopant is considered. Finally, the behavior of dopants versus iron vacancies are compared. It is demonstrated that an iron vacancy creates a deeper trap than a dopant and is thus less useful for improving the conductivity of FeO.

Several criteria are used to select dopants for FeO. The first criterion is abundance, motivated by a general preference to use low cost, readily available materials. Another criterion is the ratio between the ionic radius of the dopant and the ionic radius of the material's ions. If the radius of the dopant is similar or smaller to iron or oxygen ions, then the dopant's solubility in FeO should be non-negligible. This selection primarily leaves lithium and copper as possible p-type dopants to substitute for iron since the ratio of the ionic radii of high spin Fe(II) to Cu(I) and Li(I) is 1.03 and 1.07, respectively. The solubility of copper in wüstite at 1273 K is 0.77 at %, while wüstite solid solution appears stable at 1000° C. and at low oxygen pressures with up to at least 0.45 metal fraction of lithium (reference: Zalazinskii, A. G.; Dubrovina, I. N.; Balakirev, V. F.; Lipatov, P. V.; Zinovik, M. A.; Chufarov, G. I. *Russ. J. Phys. Chem.* 1978, 52,1547-1548). Although the ionic radius ratio of Fe(II) to Na(I) is 0.77, the maximum solubility of $Na_2O$ in FeO (in equilibrium with Fe) is very high: 0.25 metal fraction of Na at 980° C. (reference: Dai, W.; Seetharaman, S.; Staffansson, L. I. *Metall. Trans. B* 1984, 15B,319-327). Hence, the selected p-type dopants to evaluate are copper, lithium, and sodium.

The number of dopants for oxygen substitution is even more limited because nitrogen is the only element that fulfills the criteria listed above. However, our calculations show that nitrogen functions as a very strong trapping site for the hole in FeO. The hole remains trapped on nitrogen to reduce the repulsion between the otherwise three excess electrons on nitrogen. The Mulliken atomic spin population on nitrogen is 1.05, consistent with a localized hole, and is independent of any initial geometrical distortion of the $[Fe_2NO_9]^{-16}$ cluster (FIG. 1a with an N substituting for one of the bridging O anions between the Fe cations) that might have favored localization of the hole on an iron cation. It is not possible to localize the hole on an iron cation when an N dopant is nearby and therefore nitrogen is not a potential candidate for doping FeO.

Figure 3A:
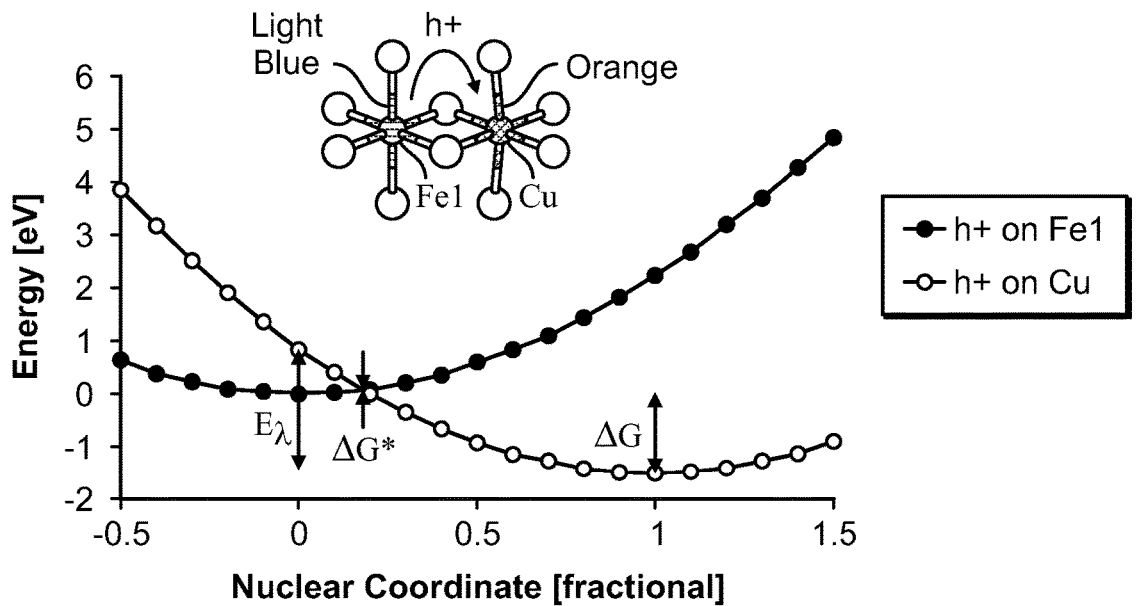
FIG. 3 shows potential energy curves along the hole transfer pathway in wüstite doped with copper (FIGS. 3a and 3b), lithium (FIGS. 3c and 3d), and sodium (FIGS. 3e and 3f). Copper, lithium, and sodium are indicated in orange, purple, and green, respectively.
Figure 3B:
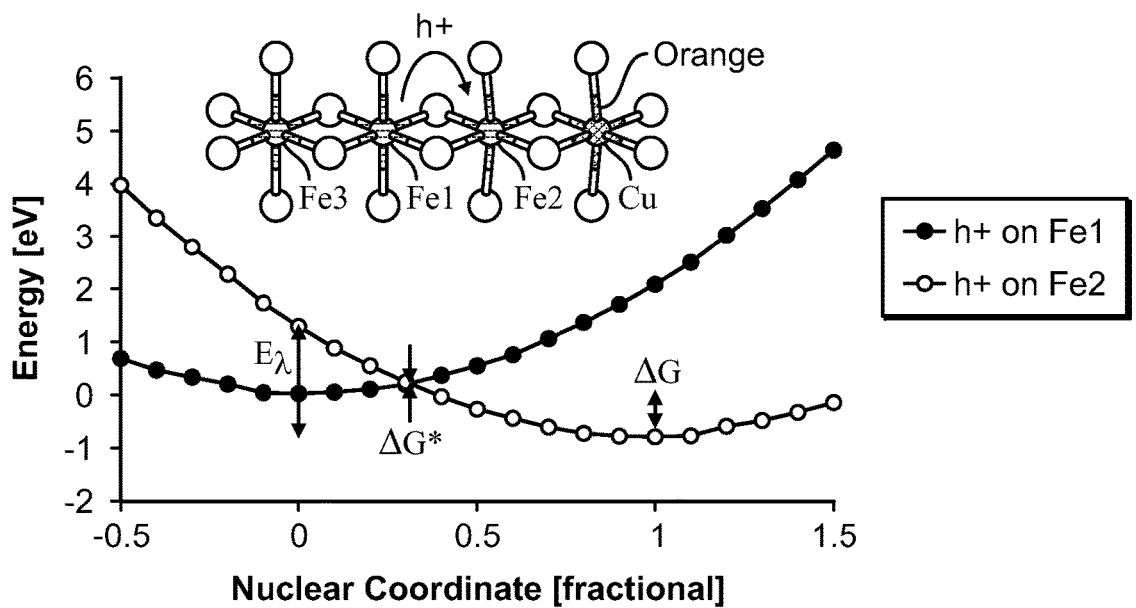

It is also predicted that a copper dopant is a trapping site for holes. As seen in FIG. 3a (and the data in the table shown in FIG. 5), the free energy change for hole transfer to copper is negative (−1.5 eV), indicating that it is energetically favorable for the hole to be on copper. This preference can be rationalized by comparing the ionization potentials of the isolated ions. The ionization potential of $Fe^{+2}$ is larger than the ionization potential of $Cu^{+1}$. Therefore, a larger amount of energy would be needed to create a hole on iron to make $Fe^{3+}$ and so the hole will be trapped once it reaches a copper site. It is also predicted that copper dopants create trapping sites not only on copper, but also create a driving force for hole transfer toward iron ions near copper. As seen in the energy curves in FIG. 3b, copper creates an electrical force (due to its reduced positive charge compared to an Fe(II) cation) that attracts the hole toward the iron closest to copper (free energy of −0.78 eV in FIG. 5). Hence, a hole transfers toward iron cations near copper and eventually traps on copper.

Figure 3C:
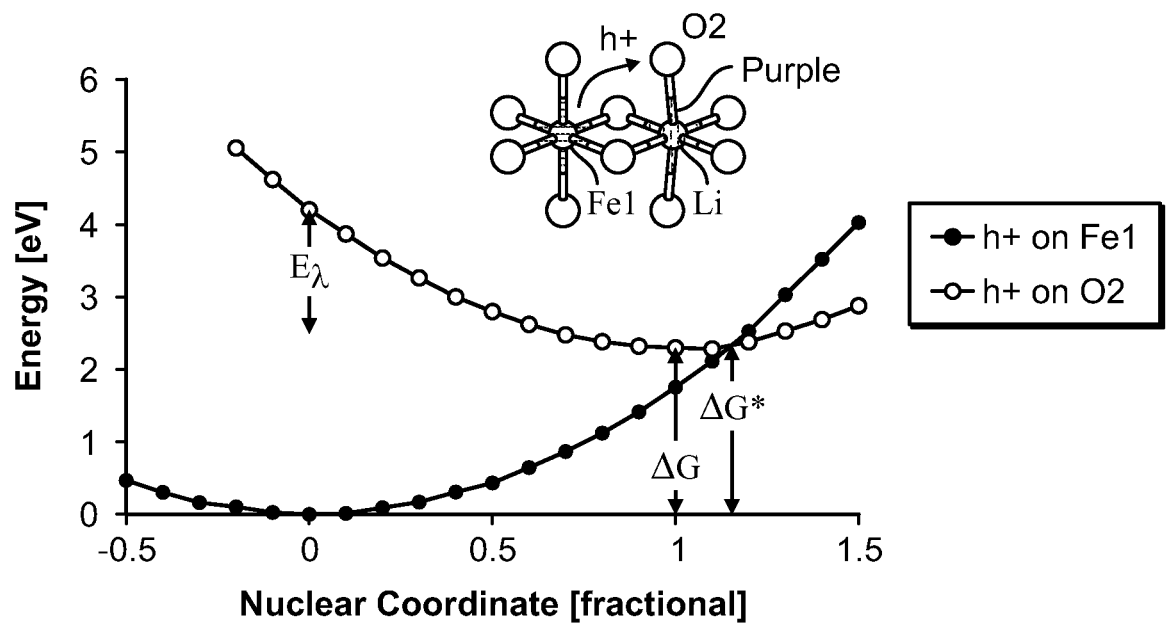
Figure 3D:
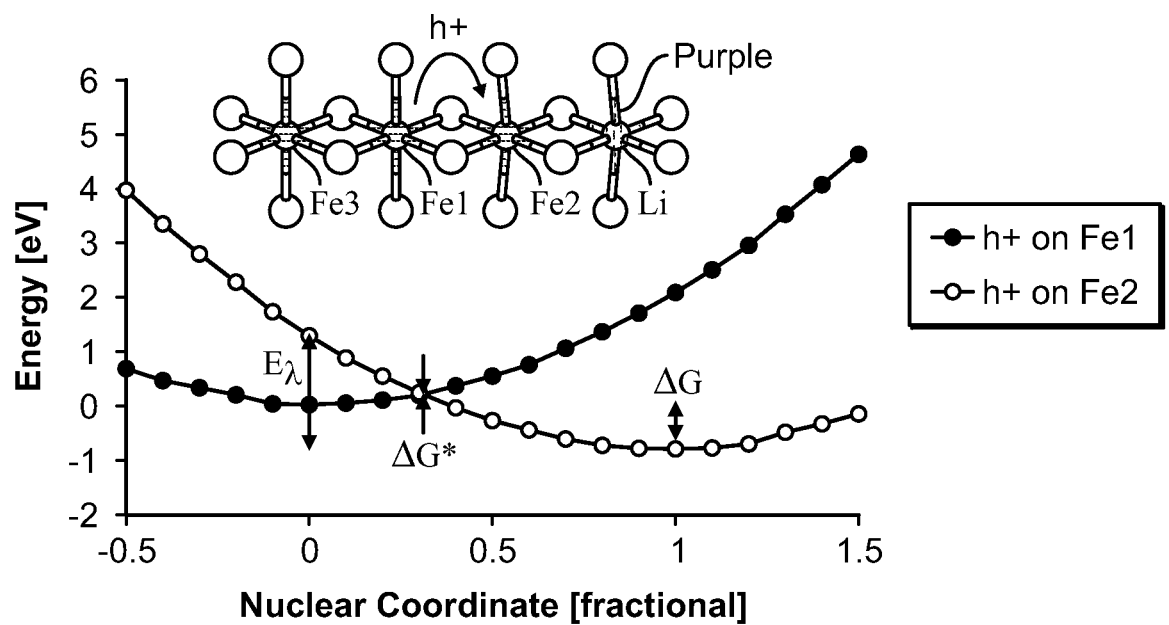
Figure 4A:
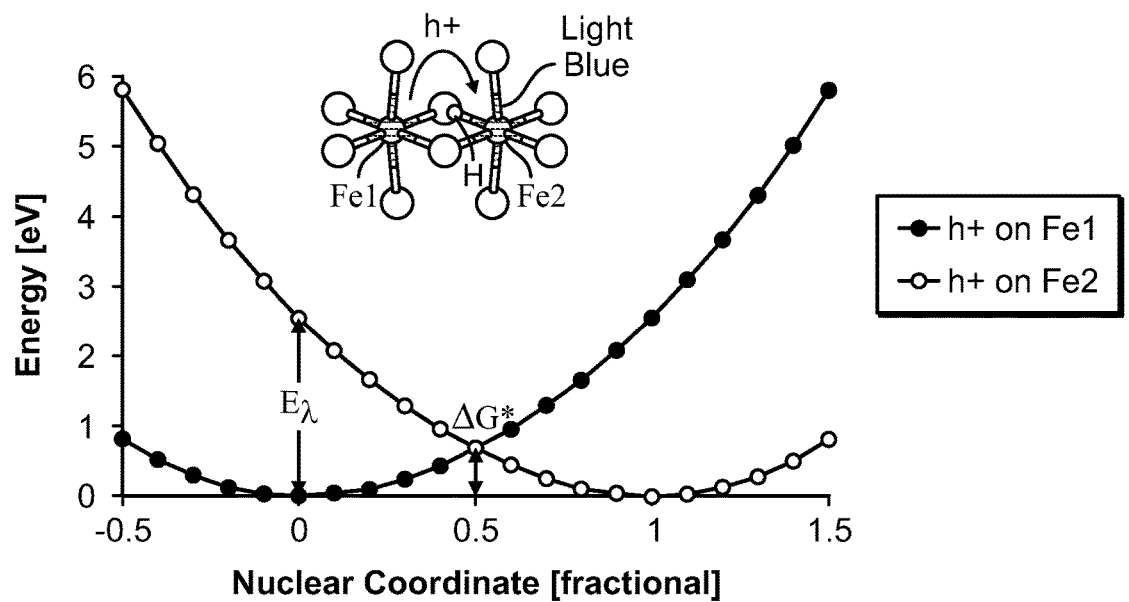
FIG. 4 shows potential energy curves along the hole transfer pathway in wüstite doped with hydrogen in the $[Fe_2HO_{10}]^{-14}$ (FIG. 4a), $[Fe_4HO_{18}]^{-26}$ (FIG. 4b), and $[Fe_3HO_{18}]^{-28}$ (FIG. 4c) embedded clusters. Hydrogen at an interstitial site is represented by a white sphere.

By contrast, a hole cannot be trapped on lithium. For a cluster with one iron cation and one lithium cation (FIG. 3c), a hole transfers from iron to oxygen rather than to lithium. Lithium (I)'s large ionization potential prevents lithium from accepting a hole. Moreover, the large positive free energy of 2.27 eV (FIG. 5) for hole transfer to oxygen clearly indicates the hole will stay on iron. However, hole transfer between two iron cations will be inhibited by either a neighboring lithium cation or a neighboring copper cation (compare FIGS. 4b and 4d, and the free energies −0.78 eV and −0.81 eV, respectively, in FIG. 5). Both copper and lithium dopants create a similar local electrostatic field that attracts the hole toward the iron closest to the dopant. Hence, lithium and copper attract holes to nearby iron cations, but lithium is not a trapping site for holes and therefore has an advantage over copper as a dopant.

Figure 3E:
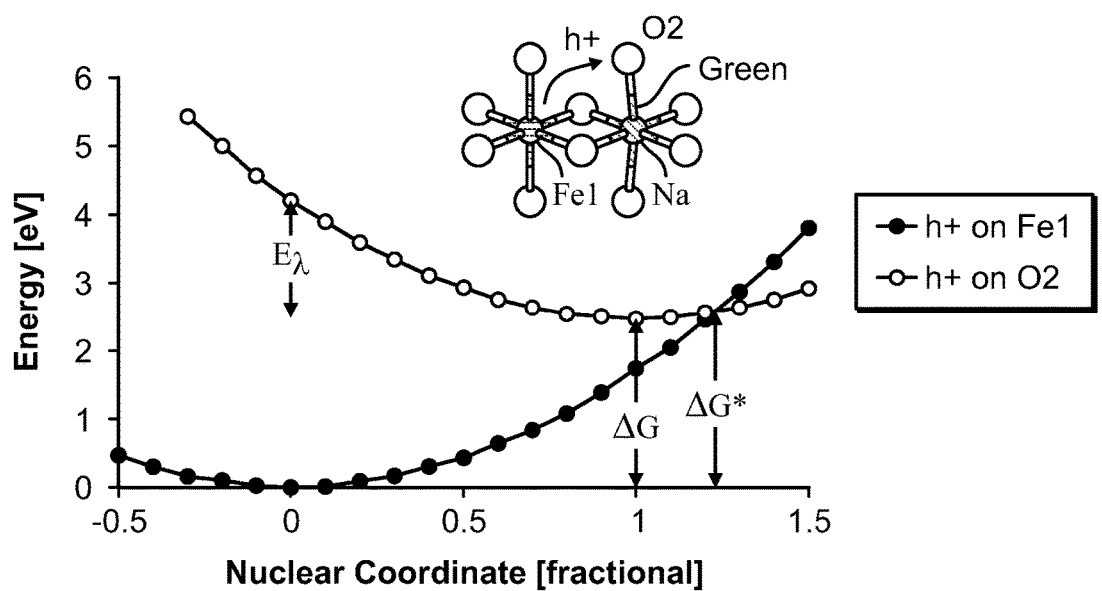
Figure 3F:
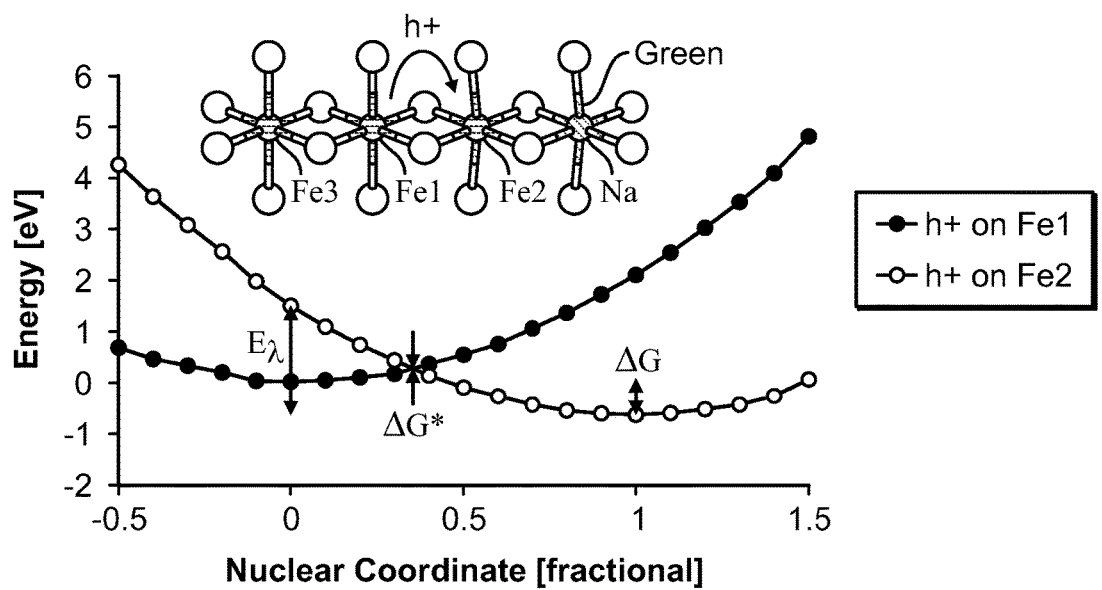

Sodium does not act as a trapping site for a hole either. Similar energy curves are obtained for sodium using the two cation site model (FIG. 3e), with a free energy difference of 2.48 eV for hole transfer from iron to oxygen (FIG. 5). Although ionization potentials decreases going down columns of the periodic table, it does not decrease sufficiently to favor hole trapping. Finally, when sodium is added to the four cation site model (FIG. 3f), the free energy difference for hole transfer between iron sites is lower than that obtained with lithium (Table 2: −0.81 eV for lithium vs. −0.64 eV for sodium). Hence, sodium introduces less effective traps that may be useful for doping FeO as well.

Many minerals containing iron and oxygen also contain hydrogen. The hydrogen dopant has two disadvantages. As mentioned earlier, hydrogen as an n-type dopant reduces the number of naturally occurring holes by donating electrons. Second, it is found that hydrogen increases the activation energy for hole transfer locally. In the embedded cluster $[Fe_2HO_{10}]^{-14}$ that models the presence of a proton and a hole near each other with the electron from the H atom assumed to have neutralized a hole elsewhere (FIG. 4a), additional energy is required for the geometrical movement of hydrogen in response to hole transfer (electronic-nuclear coupling between the hole and the proton). Consequently, the activation energy is larger than with no doping (compare 0.67 eV in Table 3 with 0.53 eV in the absence of hydrogen in FIG. 2). This second disadvantage is not important since a hole is not likely to reside on iron cations near hydrogen, as explained below.

Figure 2A:
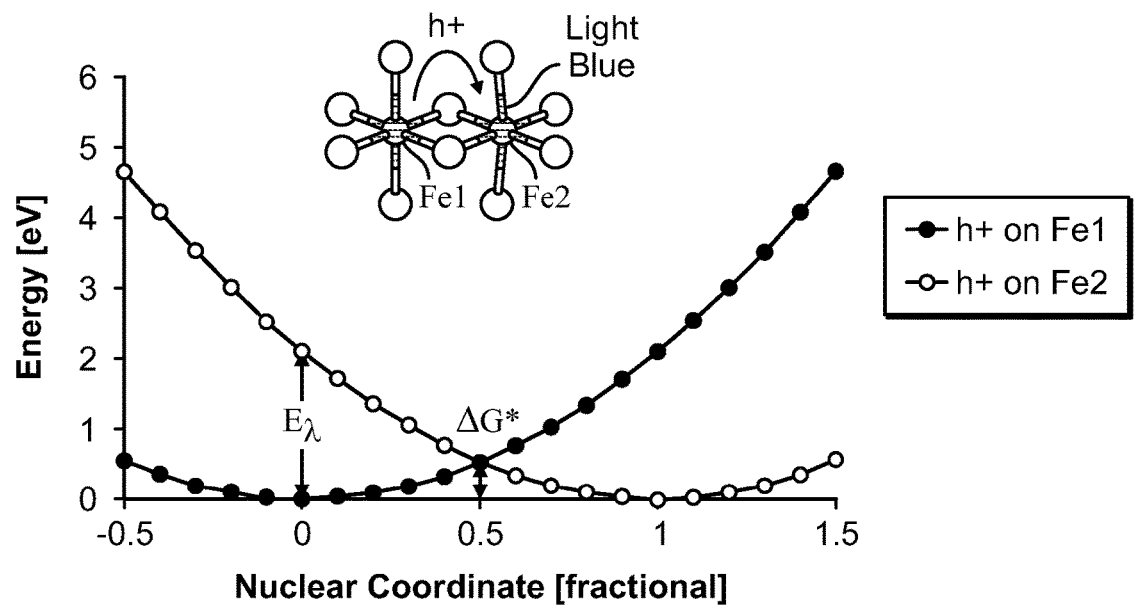
FIG. 2 shows potential energy curves along the hole transfer pathway in FeO for the embedded $[Fe_2O_{10}]^{-15}$ cluster without a vacancy (FIG. 2a), the embedded $[Fe_2O_{10}]^{-15}$ cluster with a vacancy at site V1 (FIG. 2b), the embedded $[Fe_3O_{18}]^{-29}$ cluster containing a vacancy and one hole (FIG. 2c), and the embedded $[Fe_3O_{18}]^{-28}$ cluster containing a vacancy and two holes (FIG. 2d).
Figure 2B:
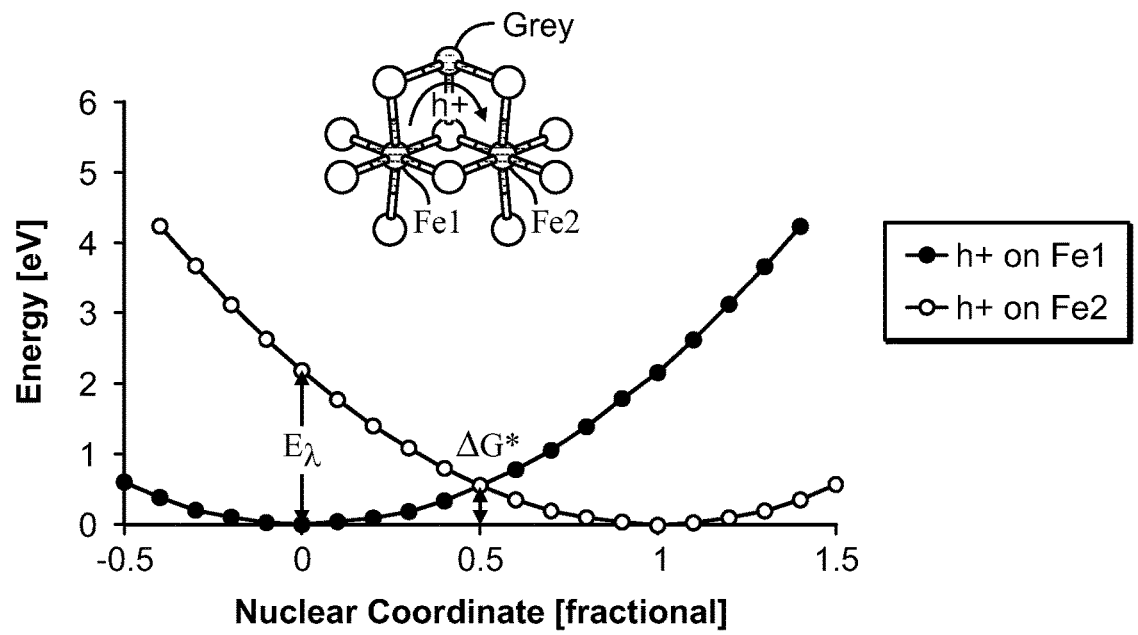
Figure 2C:
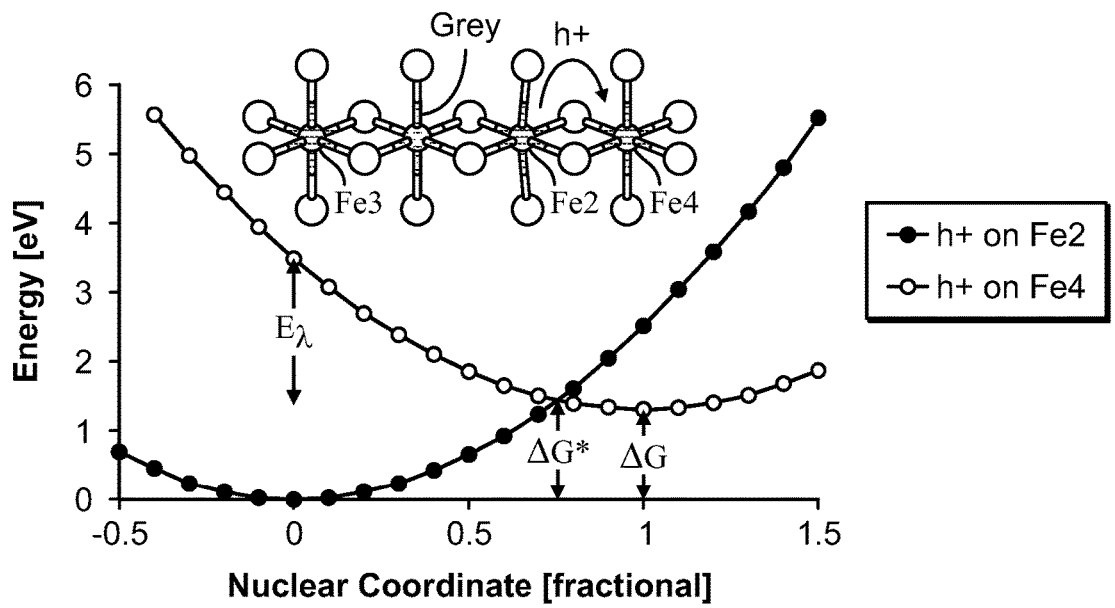
Figure 2D:
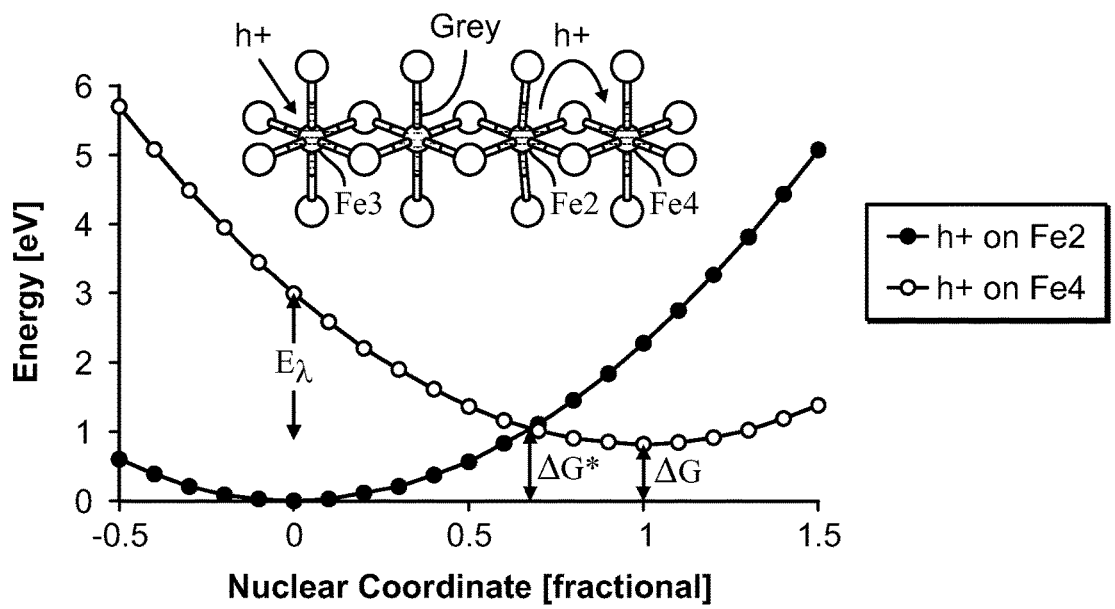
Figure 4B:
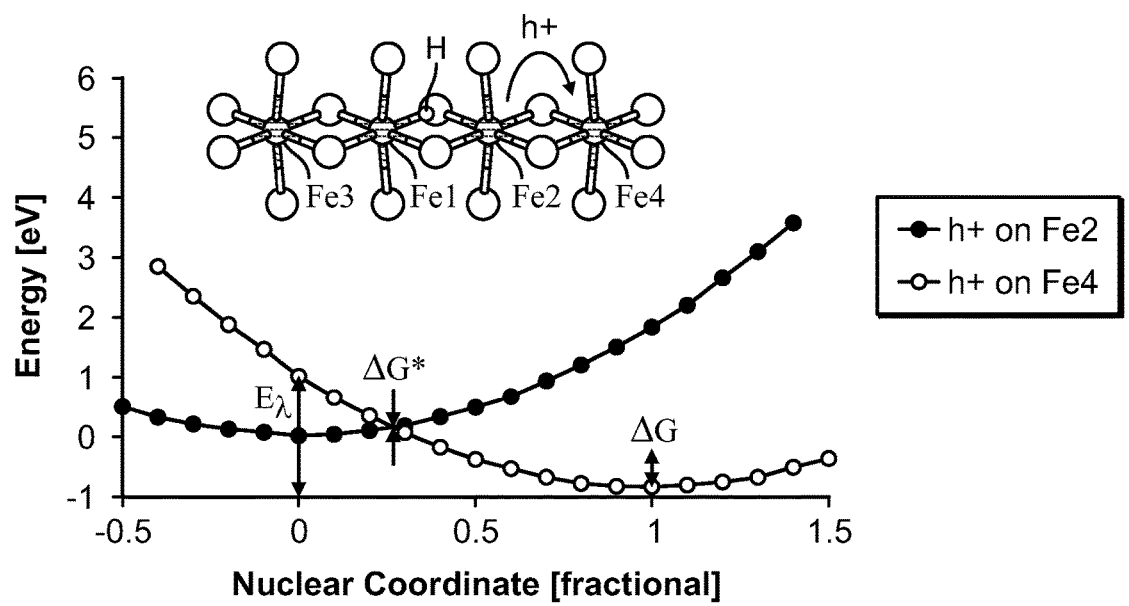
Figure 4C:
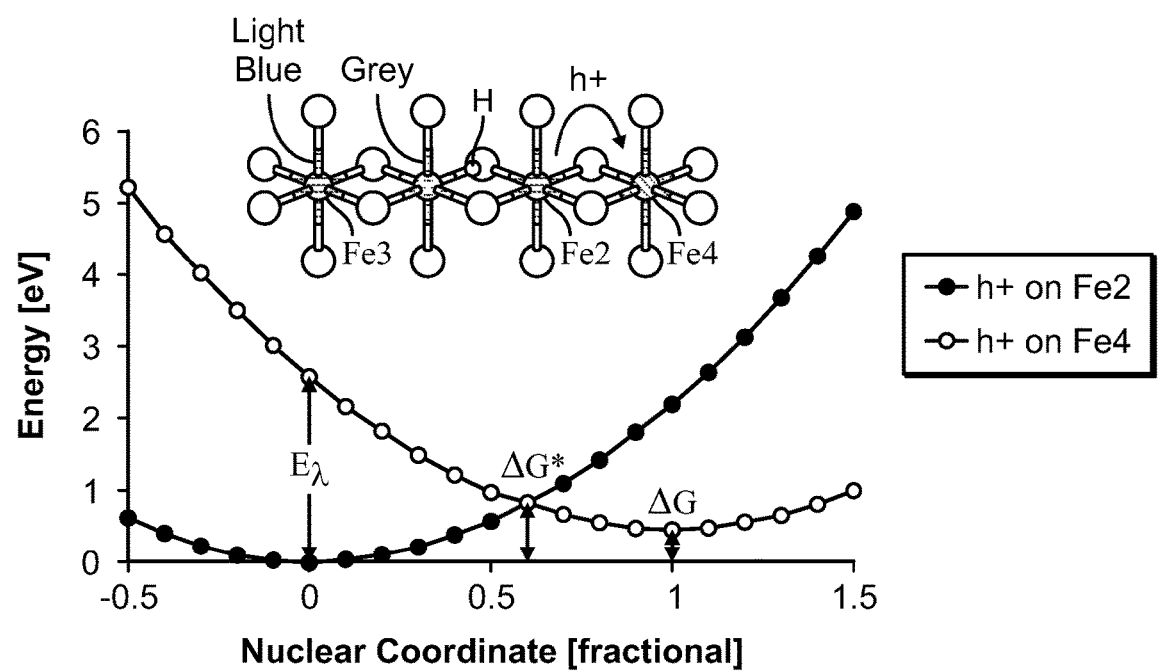

Although hydrogen donates electrons and increases the activation energy for hole transfer, hydrogen has three advantages. First, the hole transfers between iron sites near hydrogen in the embedded cluster $[Fe_2HO_{10}]^{-14}$ without trapping at the O—H bond. Hydrogen cannot trap a hole because to do so would require weakening a strong bond that forms between oxygen and hydrogen. Second, as the hole moves away from hydrogen (as shown in FIG. 4b from Fe2 to Fe4), there is a negative free energy difference driving the hole away from the (partially) positively charged dopant (−0.83 eV in FIG. 6). Hence, a hole is not trapped at either the O—H bond or at the iron site closest to hydrogen. A third advantage of hydrogen doping is that it reduces hole trapping near a vacancy. Cation vacancies and dopants prefer to be located near each other (for example, an Mg(II) n-type dopant is thought to bind to a cation vacancy in $Li_2O$).[63] A hydrogen dopant located near an iron vacancy dramatically reduces the trapping energy of a single hole near a vacancy: the free energy decreases from 1.31 eV to 0.44 eV, as shown in FIG. 2c for $[Fe_3O_{18}]^{-29}$ and FIG. 4c for $[Fe_3HO_{18}]^{-28}$, respectively, and the data in FIGS. 2 and 7. The free energy is reduced because although a hole is attracted towards a vacancy, the O—H bond strongly repels the hole. Hence, as long as the number of holes in the bulk (generated, for example, by naturally occurring vacancies) is larger than the number of electrons donated from hydrogen atoms, then hydrogen can help to free holes from traps.

Thus it is concluded that dopants are better than cation vacancies for improving the conductivity of FeO. A hydrogen dopant does not trap holes and exhibits a reduced trapping energy near a vacancy. The driving force for hole trapping near a Cu, Li, or Na dopant (respectively |ΔG|=0.78, 0.81 eV, and 0.64 eV, Table 2) is much smaller than the driving force for hole trapping near a vacancy with a single hole present (|ΔG|=1.31 eV, Table 1). The large electrostatic difference between the absence of an iron cation (+2) replaced by a p-type dopant (+1) is undoubtedly responsible for the reduced trapping by the dopant. Of course, a vacancy contributes two holes, while a substitutional dopant donates a single hole to the crystal; simply doubling the dopant concentration can overcome this limitation.

Also disclosed herein are iron (II) oxide alloys as semiconductors for solar energy conversion devices. The disclosed compositions of matter can be used for improving the efficiency and decreasing the cost of existing solar energy conversion devices. The materials are transition metal oxide alloys formed from low cost and non-toxic parent materials. The disclosed materials overcome several limitations that appear in the parent materials, such as large band gap, inadequate band positions, thermal instability and high electron-hole recombination.

Key properties for efficient solar energy conversion, such as band gap, band positions, thermodynamic stability, and electron-hole recombination rate can be optimized with the disclosed material compositions, as further disclosed in U.S. provisional application 61/730,384 filed Nov. 27, 2012 which is incorporated herein in its entirety. Additional disclosure is also contained in M. Caspary Toroker and E. A. Carter, "Transition metal oxide alloys as potential solar energy conversion materials", J. Mater. Chem. A 1, 2474 (2013), which is incorporated herein in its entirety. A strong reduction in the band gap toward the optimal range for solar energy conversion is accomplished by including iron in all alloys.

Applications include using these materials as semiconductors in photovoltaic cells, as electrodes in photo-electrochemical cells, and as photocatalysts, for electricity and fuel production. The versatility of these materials (different chemical compositions) may be used to construct several products. Furthermore, the variety of materials with composition dependent band gaps and band positions can be exploited to generate highly efficient multi junction photovoltaic cells or photocatalytic electrodes in a z-scheme (operating at different fuel producing processes).

Conventional semiconductors used in the solar industry such as crystalline silicon require an expensive purification process to obtain pure and defect-free materials. Transition metal oxides are much more affordable, because of their abundance, ease of synthesis, and low cost (in dollars and energy) for manufacturing at scale. Transition metal oxides offer additional benefits when they are alloyed, that is band gaps that are close to the visible range of the solar energy spectrum (highest photon intensity), optimal band positions, enhanced mobility (via reduced electron-hole recombination rate) and thermodynamic stability.

The disclosed composition of matter is made by mixing iron (II) oxide with manganese (II) oxide, nickel (II) oxide, zinc (II) oxide or magnesium (II) oxide at several alloying concentrations. The disclosed materials may be used commercially as a photovoltaic solar cell that costs less than existing technologies. Furthermore, if a metal oxide such as zinc (II) oxide is used in a solar cell, alloying with iron (II) oxide may improve its functionality. The disclosed materials may also be used commercially in a photoelectrochemical cell or photocatalyst for conversion of $CO_2$ and $H_2O$ to fuels.

Alloying has been observed to modify band gaps in III-V semiconductors, in oxides such as $Cd_{1-x}Ca_xO$ $Zn_{1-x}Mg_xO$, and $(Ga_{1-x}Zn_x)(N_{1-x}O_x)$, and in many other semiconductor alloys. The band gap of an alloy depends on the band gaps of the parent materials according to the following empirical relation:

$$E_g = xE_g^1 + (1-x)E_g^2 - bx(1-x) \quad (4)$$

where the band gap of the alloy, $E_g$, is expressed as the average of the band gaps of the two pure materials, $E_g^1$ and $E_g^2$, weighted by the alloying fraction x (0≤x≤1), with any deviation from the average given by the bowing parameter "b". A similar relation can also be found theoretically within the virtual-crystal approximation, where each site in the alloy is represented by an average ("virtual") potential of two parent materials. As can be seen in Eq.1, the band gap of the alloy does not always depend linearly on the alloying fraction x (when the bowing parameter "b" is not zero) and therefore may not be just a weighted average of the band gaps of the two pure materials.

Transition metal oxide (TMO) alloys generally do not have an average of the band gaps of the two pure materials. Previous studies have usually explained the deviation from the average in terms of the difference in electronegativity or geometry between the two pure materials. Disclosed herein is another explanation for the deviation from the average, based on differences in band alignments of the parent materials, and exploit this deviation to optimize the band gap. At large deviations from the average (when the bowing parameter "b" is positive and large in Eq. 4), the band gap of the alloy can be smaller than the band gap of both parent materials.

The origin of the band gap reduction in $(Ga_{1-x}Zn_x)(N_{1-x}O_x)$ was not fully understood until very recently. Several explanations had been proposed, including N 2p–Zn 3d hybridization at the valence band maximum (VBM). Very recent X-ray emission and absorption spectroscopy measurements show that the band alignment determines the band gap reduction in this material. Disclosed herein is a new metric for band gap reduction, the band gap center (BGC) offset, the importance of which is revealed in this work by systematically alloying oxides with different band edge positions. The BGC is the energy at the center of the band gap, and corresponds to the Fermi level in an undoped, defect-free material. In contrast to the band edges, which require demanding many-body quantum mechanics calculations or careful photoemission spectroscopy measurements, obtaining the BGC is much simpler. This BGC offset can be determined a priori either from density functional theory type calculations or by work function measurements on the parent materials, to determine which are worth alloying to achieve smaller band gaps.

Key properties affecting solar energy conversion efficiency, including band gap, character of band edge states, and band positions, are improved by alloying several materials including magnesium (II) oxide (MgO), manganese (II) oxide (MnO), iron (II) oxide (FeO), nickel (II) oxide (NiO), and zinc (II) oxide (ZnO). All of these oxides have band gaps that are larger than optimum for solar energy conversion, but FeO has the lowest band gap, suggesting that alloying with FeO may help in reducing their band gaps. Hence FeO was a parent material for all alloys considered.

The applicability of FeO-based alloys for solar energy conversion was tested by evaluating three key properties: the band gap, the character of the band edge states, and the band edge energy positions. The section ends with a fourth novel property, the band gap center (BGC) position, which are demonstrated to be a promising metric that can be used to select candidate alloys for potential use in solar energy conversion.

Figure 8:
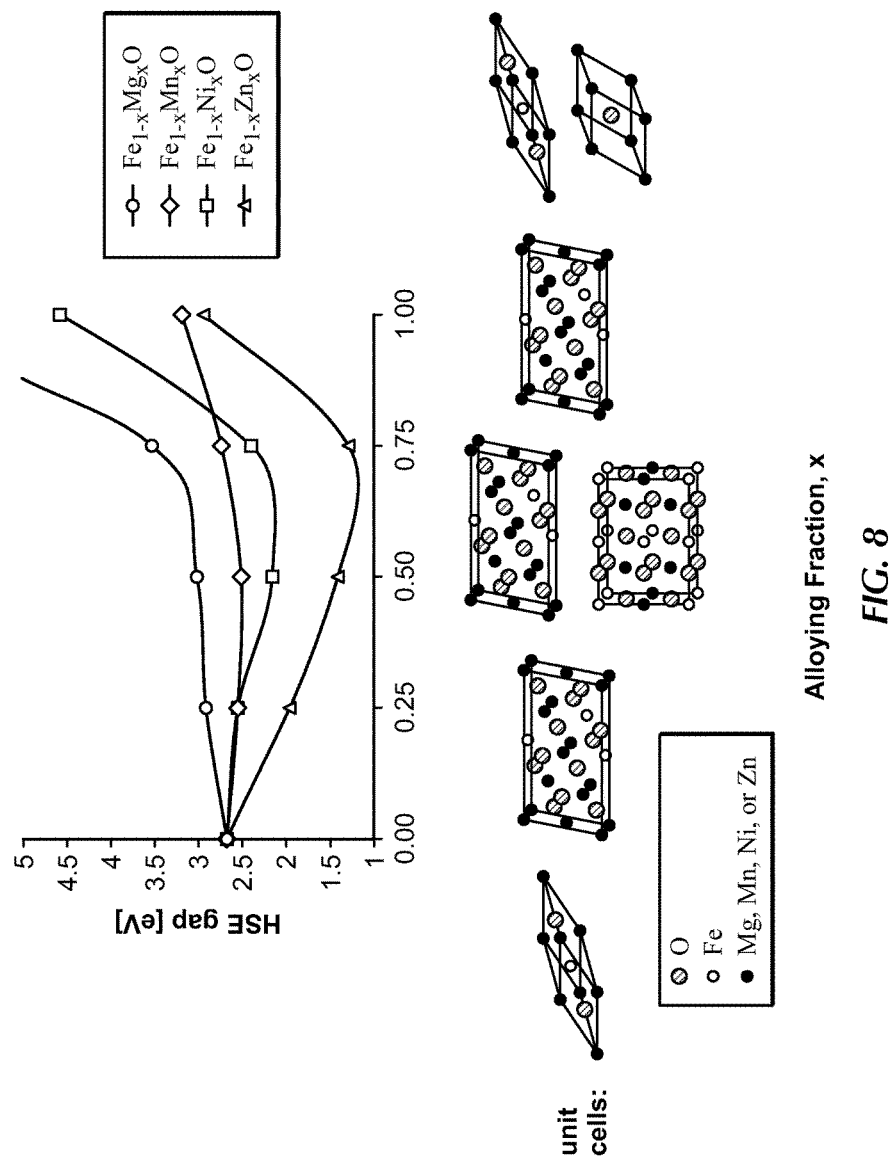
FIG. 8 is a graph showing the DFT-HSE evaluation of the band gap dependence on the alloying fraction x for the alloys $Fe_{1-x}Mg_xO$, $Fe_{1-x}Mn_xO$, $Fe_{1-x}Ni_xO$ and $Fe_{1-x}Zn_xO$. Unit cells are shown in the lower part of the figure for each alloying fraction.

The first property, the band gap, is a crucial contributor to determining the efficiency of solar energy absorption. The band gaps of MgO, MnO, NiO, and ZnO are too large for efficient solar energy absorption (≥3 eV). As can be seen in FIG. 8, the band gaps are successfully reduced upon alloying with FeO. A range of gaps are produced, with the following relation:

$$E_g^{HSE}(Fe_{1-x}Mg_xO) > E_g^{HSE}(Fe_{1-x}Mn_xO) > E_g^{HSE}(Fe_{1-x}Ni_xO) > E_g^{HSE}(Fe_{1-x}Zn_xO), \quad (5)$$

where $E_g^{HSE}$ denotes a band gap calculated with the hybrid (HSE) XC functional. Unexpectedly, the alloy gaps are not ordered according to the relative magnitude of the pure materials' band gaps. Moreover, some alloy gaps are lower than the gaps of the two parent materials, rather than being an average of them. The band gaps of $Fe_{1-x}Mg_xO$ alloys are the largest, larger than the gap of pure FeO but lower than the gap of pure MgO (~7 eV) by more than 3 eV. The band gaps of $Fe_{1-x}Mn_xO$ alloys are lower than the gap of pure MnO and are near the gap of pure FeO. The gap of $Fe_{1-x}Ni_xO$ at an alloying fraction of x=0.25 is also similar to that of pure FeO. However, at larger alloying fractions, the gap of $Fe_{1-x}Ni_xO$ is significantly reduced, lower than the gaps of the two pure materials, FeO and NiO. Finally, the $Fe_{1-x}Zn_xO$ alloys have the lowest gaps, considerably lower than both of its parent materials. Thus, the $Fe_{1-x}Zn_xO$ and $Fe_{1-x}Ni_xO$ alloys have an advantage over the $Fe_{1-x}Mg_xO$ and $Fe_{1-x}Mn_xO$ alloys, because their gaps are lower and closer to the optimal band gap for efficient solar energy conversion.

Some portion of the reduction in the band gap may be an artifact of the computational method, specifically the choice of approximate XC functional. Indeed, the HSE XC functional underestimates the gaps of pure MnO and MgO, and consequently may bias the calculation toward reducing the band gap of their alloys. However, since the gaps of MnO and MgO alloys with FeO are too large anyway, this underestimation only serves to strengthen the conclusion that these alloys have larger gaps. On the other hand, the HSE XC functional overestimates the band gap of pure (rocksalt) ZnO and NiO (and FeO), while their alloy band gaps are nevertheless reduced. This band gap overestimation for these three materials strengthens our conclusion that alloys of FeO with NiO or ZnO may be suitable for solar energy applications. Moreover, the fact that the HSE functional sometimes overestimates gaps indicates that its use is not the primary source of the reduction in band gap.

Figure 9A:
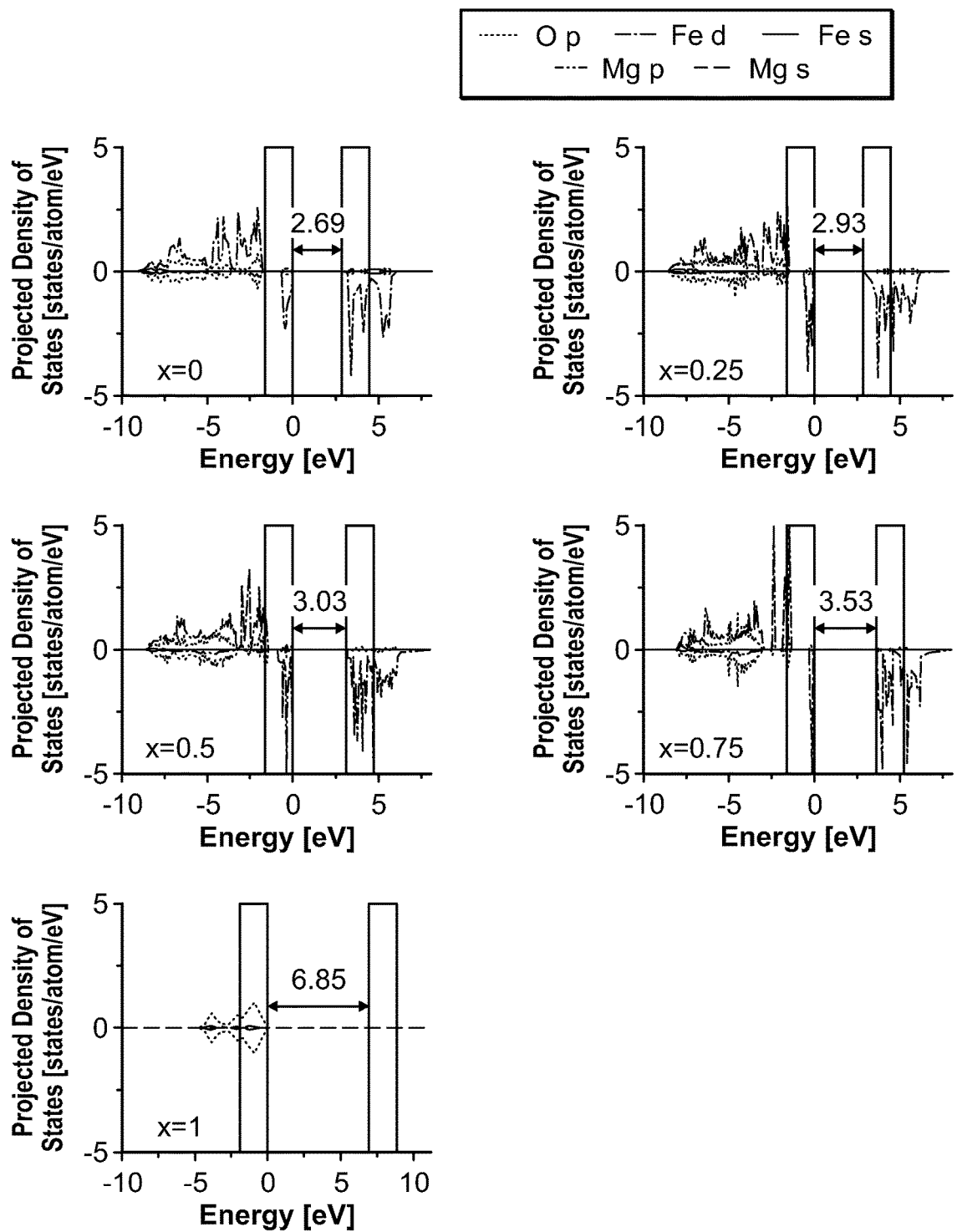
FIG. 9 shows projected densities of states of the alloys (a) $Fe_{1-x}Mg_xO$, (b) $Fe_{1-x}Mn_xO$, (c) $Fe_{1-x}Ni_xO$ and (d) $Fe_{1-x}Zn_xO$, at alloying fractions of x=0, 0.25, 0.50, 0.75 and 1.
Figure 9B:
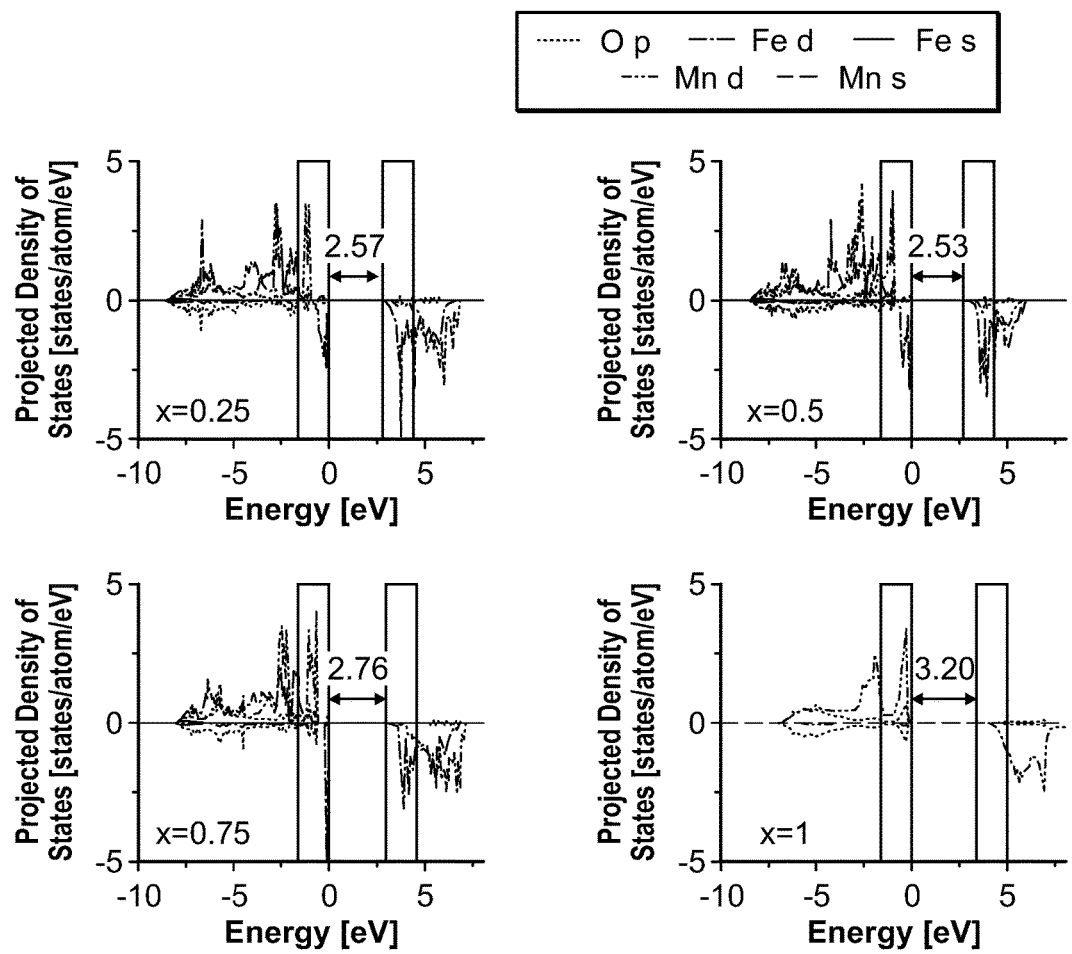
Figure 9D:
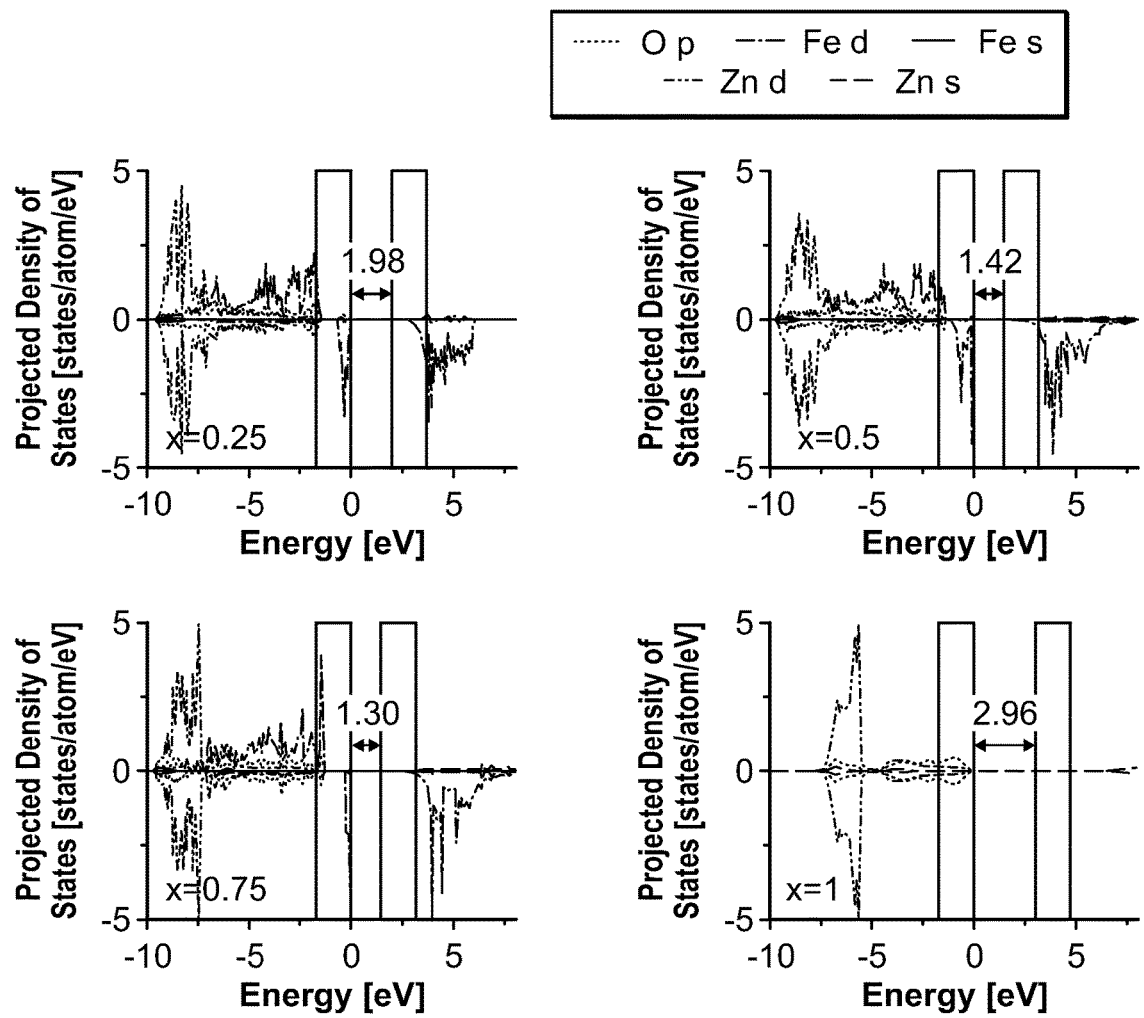
Figure 10A:
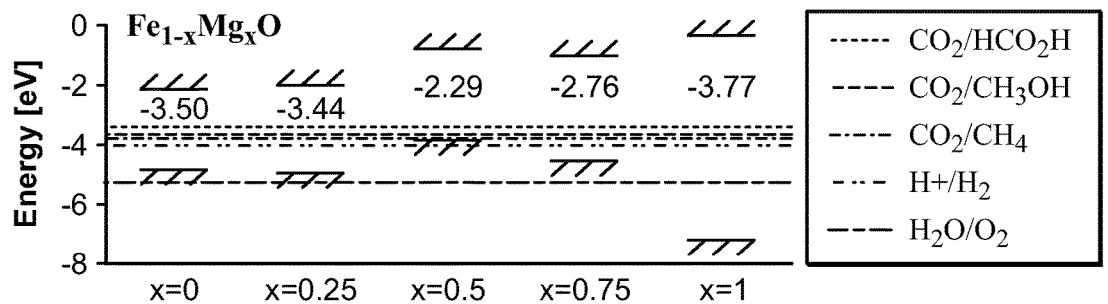
FIG. 10 shows band edge positions (solid black lines) and band gap centers (dashed black lines) of the alloys (a) $Fe_{1-x}Mg_xO$, (b) $Fe_{1-x}Mn_xO$ (c) $Fe_{1-x}Ni_xO$, and (d) $Fe_{1-x}Zn_xO$, at alloying fractions of x=0, 0.25, 0.50, 0.75 and 1, in comparison with measured free energies for water splitting and $CO_2$ reduction reactions producing methane, methanol, and formic acid at pH=7.
Figure 10B:
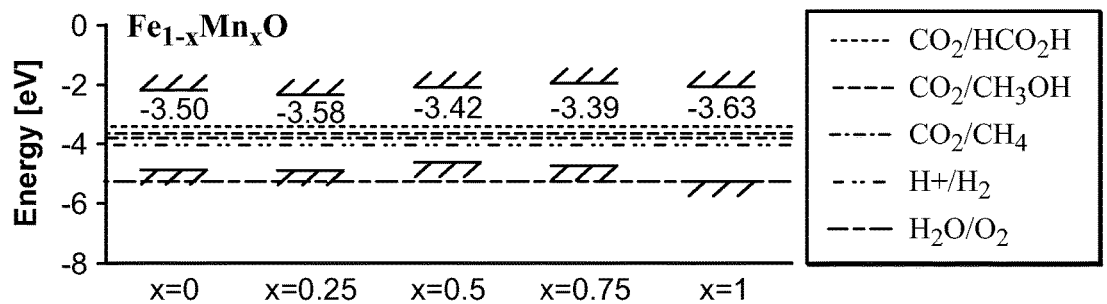
Figure 10C:
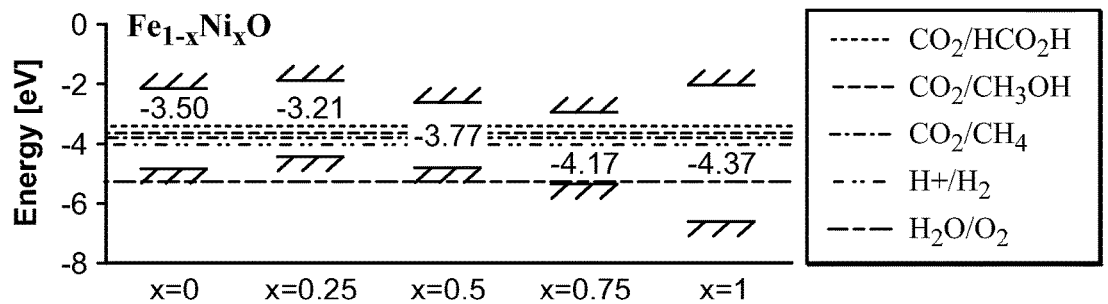
Figure 10D:
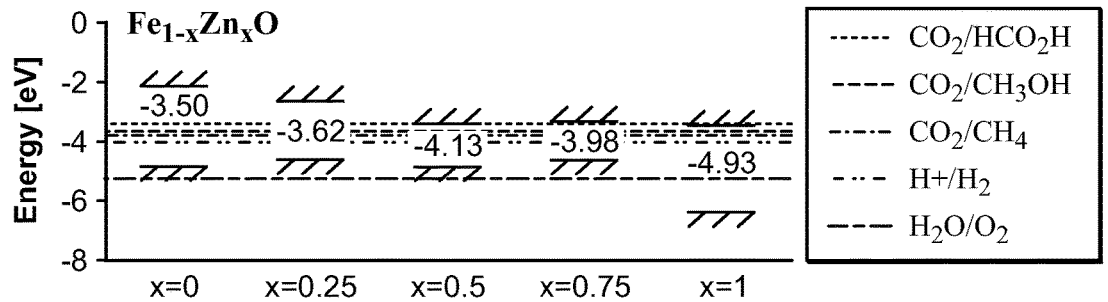

The second property considered is the type of states at the band edges (VBM and CBM), which is responsible for determining the electronic and optical properties of the materials. As can be seen in FIG. 9, in all of the alloys, iron d-states appear at the VBM. In contrast to the non-FeO parent oxides, the VBM of the alloys is not dominated by oxygen p-type states. Instead, the oxygen p-states are at the mid-to-lower part of the valence band. The $Fe_{1-x}Mg_xO$ and $Fe_{1-x}Mn_xO$ alloys have iron d-states at the CBM as well. Magnesium s-states, which appear at the CBM of pure MgO (too small to be seen in FIG. 9), are further inside the conduction band of the $Fe_{1-x}Mg_xO$ alloy. Manganese d-states appear at both band edges of pure Mne, but are further inside the bands in the $Fe_{1-x}Mn_xO$ alloy. Unoccupied iron s-states are spread over the conduction band of all alloys, and in $Fe_{1-x}Mn_xO$, manganese s-states span the conduction band as well. Hence, iron states dominate the band edges of $Fe_{1-x}Mg_xO$ and $Fe_{1-x}Mn_xO$, as they do in FeO (i.e., they are Hubbard-type insulators). These materials may therefore be useful as photoelectrodes that preserve the electronic and optical properties of FeO. Moreover, $Fe_{1-x}Mg_xO$ and $Fe_{1-x}Mn_xO$ should be of more practical use than FeO, because MgO and MnO are thermodynamically stable at room temperature unlike FeO. Preliminary evidence based on total energy differences suggests formation of these alloys may be thermodynamically favorable.

The character of the band edges of the $Fe_{1-x}Ni_xO$ and $Fe_{1-x}Zn_xO$ alloys is influenced by both pure materials, as opposed to the band edges of $Fe_{1-x}Mg_xO$ and $Fe_{1-x}Mn_xO$ that have the band edge character of pure FeO alone. As can be seen in FIG. 9 for the $Fe_{1-x}Ni_xO$ and $Fe_{1-x}Zn_xO$ alloys, the CBM includes nickel d-states and zinc s-states, as in pure NiO and ZnO, respectively. Nickel d-states are further inside the valence band of the $Fe_{1-x}Ni_xO$ alloy, while they appear at the VBM of pure MO, together with oxygen p-states. Zinc d-states are at the lower part of the valence band in both the alloy $Fe_{1-x}Zn_xO$ and in pure ZnO. Iron d-states are also in the upper part of the conduction band. At alloying fractions x=0.25 and x=0.50 in the $Fe_{1-x}Ni_xO$ alloy, significant hybridization between iron d-states and nickel d-states occurs at the CBM. Less hybridization of iron states is present at the CBM of $Fe_{1-x}Zn_xO$. Unoccupied nickel s-states also span the conduction band of the $Fe_{1-x}Ni_xO$ alloy. Therefore, photon absorption by the $Fe_{1-x}Ni_xO$ ($Fe_{1-x}Zn_xO$) alloys will produce holes in iron states at the VBM and electrons in nickel (zinc) type states at the CBM, i.e., the band gap transition involves charge transfer from iron to the alloying metal. The electron-hole recombination rate may be low in such materials, in which the band edges differ in orbital type and location (weak orbital coupling). Hence, $Fe_{1-x}Ni_xO$ and $Fe_{1-x}Zn_xO$ alloys may be suitable for efficient solar energy absorption and subsequent charge transport because they have both adequate band gaps (~1.3-2.6 eV) and possibly low electron-hole recombination rates.

It is predicted that all of these alloys have indirect band gaps. The CBMs are located at the gamma point in most alloys, but the VBMs are not. Since the VBM of FeO is not at the gamma point and the VBMs of the alloys are dominated by iron d-states, then the VBM of the alloys is not at the gamma point as well (the VBM is located at the k-point (0.3,0.4,0) for alloys $Fe_{0.5}Mg_{0.5}O$ and $Fe_{0.75}Ni_{0.25}O$, at (0.3,0.4,0.5) for $Fe_{0.5}Mn_{0.5}O$, at (0.3,0,0.5) for $Fe_{0.75}Mg_{0.25}O$, and at (0,0.4,0.5) for the rest of the alloys, and is on average 0.25 eV higher than the valence band edge at the gamma point). An indirect band gap is not necessarily bad: it is certainly a disadvantage for efficient light absorption but it does inhibit radiative electron-hole pair recombination. After all, the most common photovoltaic material has an indirect band gap, namely silicon.

Another optical aspect is the reflectivity index, which determines what fraction of light is lost to reflection. Based on the known correlation between the reflectivity index and the band gap, these alloys may offer a range of optical capabilities that could be exploited for efficiently collecting solar energy (e.g., with anti-reflection coatings).

The third property, the band edge positions (VBM and CBM), shows that TMO alloys may be useful for producing fuel from solar energy. As seen in FIG. 13, all of the alloys have conduction band edge positions above the free energy for reducing water and carbon dioxide, and therefore could be used as photocatalysts for reduction reactions in a z-scheme. However, the VBM of most alloys are above the free energy for the oxidation of water, and are therefore unable to catalyze water oxidation. Notably, the VBM of the $Fe_{1-x}Ni_xO$ alloy at an alloying fraction of x=0.75 is just lower than the free energy for oxidizing water, and therefore might be usable for water splitting.

The fourth property considered is the BGC position. It was observed that alloys with larger differences in BGC positions of the parent materials (normalized by half the difference in the band gaps of the parent materials) also have smaller band gaps and possibly low electron-hole radiative recombination rates. The contribution of the BGC position in determining the band gap and electron-hole recombination rate, is most significant for the $Fe_{1-x}Zn_xO$ alloy because its difference in BGC positions is largest (1.4 eV). It is possible to derive an explanation for the BGC influence on the band gap and electron-hole recombination rate, as demonstrated on $Fe_{0.5}Zn_{0.5}O$.

In the case of $Fe_{0.5}Zn_{0.5}O$, the band edges of the parent materials are offset one against each other (FIG. 10):

$$E_{VBM}(FeO) > E_{VBM}(ZnO) \quad (6a)$$

$$E_{CBM}(FeO) > E_{CBM}(ZnO) \quad (6b)$$

$$E_{BGC}(FeO) > E_{BGC}(ZnO) \quad (7)$$

Hence, a difference in BGC positions of the pure materials is a metric (and a sufficient condition) indicating that at least one of the band edges is also offset. When the band edge offset is large, there is little hybridization between the two materials at the band edge, and each of the alloy band edge positions is determined by a different one of the parent materials, i.e., $E_{VBM}(Fe_{0.5}Zn_{0.5}O) \cong E_{VBM}(FeO)$ and $E_{CBM}(Fe_{0.5}Zn_{0.55}O) \cong E_{CBM}(ZnO)$ (see $Fe_{0.5}Zn_{0.5}O$ in FIG. 10). Each of the alloy band edges also is associated with orbitals from different atoms, originating from a different one of the parent materials. In such materials that have band edges with different orbital types, the electron-hole recombination rate may be small due to small orbital overlap and hence weak coupling, and the band gap is smaller than the band gap of both parent materials, i.e., $E_g(Fe_{0.5}Zn_{0.5}O) \cong E_{CBM}(ZnO) - E_{VBM}(FeO)$. Thus, analyzing BGC positions may be useful as a new strategy to obtain materials with lower gaps and recombination rate.

This hypothesis can be tested by measuring the BGCs and band gaps. As an example, it is possible to use the BGC metric to understand the $(Ga_{1-x}Zn_x)(N_{1-x}O_x)$ alloy that was previously discovered to be an effective photocatalyst for water splitting. The BGCs of GaN and ZnO are offset by 0.8 eV. The alloy has a band gap of 2.58 eV (at alloying concentration of x≅0.13), which is smaller than those of both parent materials (3.4 and 3.2 eV for GaN and wurtzite ZnO, respectively) by ~0.7 eV and has band edges with different types of orbitals (the VBM is associated with nitrogen-type orbitals at x≅0.13 and at the CBM zinc-type orbitals gradually increase in dominance as the ZnO concentration increases). The crystal structure of the pure materials GaN and ZnO are the same and their lattice constants are similar. Hence, the band gap is not reduced because of differences in geometries but rather due to differences in band alignments. This explanation is consistent with very recent X-ray emission and absorption spectroscopy measurements on a $(Ga_{1-x}Zn_x)(N_{1-x}O_x)$ heterojunction that shows the CBM decreasing with increasing x.

A similar rationale can be used to explain the reduction in the band gap of a newly proposed photocatalyst $Mn_{1-x}Zn_xO$ (reference: D. K. Kanan and E. A. Carter, J. Phys. Chem. C, 2012, 116, 9876-9887). The position of the band edges of ZnO that are calculated herein show that there is an offset in the band edges of MnO and ZnO that cause a reduction in the CBM position for the alloy.

Several TMO alloys are disclosed herein as potential photoelectrodes and photocatalysts, including $Fe_{1-x}Mg_xO$, $Fe_{1-x}Mn_xO$, $Fe_{1-x}Ni_xO$, and $Fe_{1-x}Zn_xO$. The band gap and absolute band edge positions are crucial for determining the efficiency of absorbing and utilizing solar energy and are therefore calculated here with the use of hybrid DFT and DFT+U for all of these oxides. The band gaps of materials with too large a gap for efficient solar energy conversion, such as MnO, NiO, ZnO, and MgO, are shown to be reduced when they are alloyed with FeO. A range of gaps for a variety of materials are obtained, where the alloys $Fe_{1-x}Ni_xO$ and $Fe_{1-x}Zn_xO$ exhibit much lower gaps than the gaps of $Fe_{1-x}Mn_xO$ and $Fe_{1-x}Mg_xO$, and where the former are closer to the optimal band gaps for efficient solar energy conversion.

It was determined that all of the alloys containing FeO may be candidates for the reduction reactions involved in fuel production, but most of them cannot be used for the oxidation of water since their VBM lies above the free energy for oxidizing water. One possible exception is $Fe_{0.25}Ni_{0.75}O$, with band edges that may be adequate for water splitting.

The work disclosed herein has revealed a design strategy for producing materials with enhanced solar energy conversion efficiency, as a result of reducing the band gap and potentially the radiative electron-hole recombination rate. Reducing the band gap may be achieved through alloying with a material that has a smaller band gap (such as FeO, CoO, etc.). An important concept is that the alloy band gap may be substantially lower than the band gaps of either of the two parent materials when the band gap center positions of the pure materials are significantly different (by at least half the difference in band gaps of the parent materials). Alloying materials that have greatly different band gap center positions may have an additional benefit of reducing electron-hole recombination rate, because of different chemical character at the alloy band edges. Because the absolute position of the band gap center is effectively given by the material's work function, this concept offers a way to screen potential alloys theoretically by calculating the absolute band gap center position of parent materials or experimentally by simply measuring their work functions, and looking for combinations with large differences in work function (or equivalently, BGC). Alloys of such materials may be promising solar energy conversion materials. Of course, theory was used to establish this strategy and further experimental measurements of band gaps and band gap centers (respectively derivable from optical absorption or photoemission/inverse photoemission and from work function measurements) may also be used.

Figure 7A:
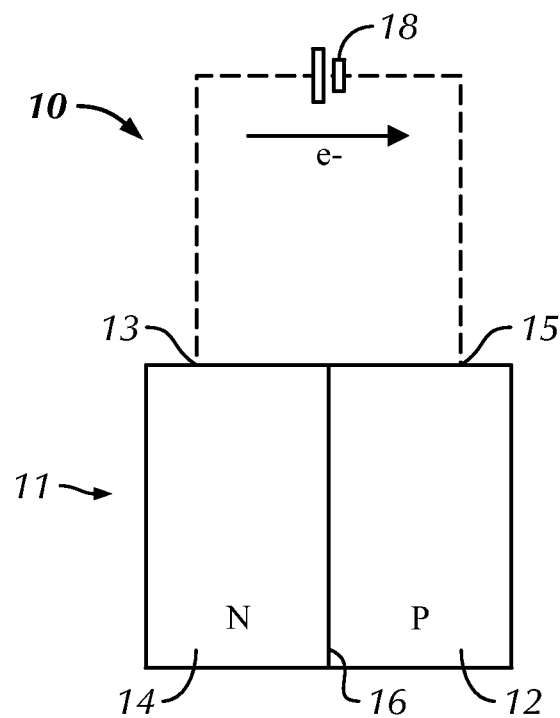
FIG. 7a is a block diagram of a photovoltaic device including a photoelectrode constructed in accordance with the disclosure herein.

FIG. 7a is a block diagram of a photovoltaic device 10 including a p-type semiconductor 12 and an n-type semiconductor 14 configured in a p-n junction 16. The p-type semiconductor is generally fabricated using the FeO compositions disclosed herein. The n-type semiconductor may be constructed using convention materials as is well known to those skilled in the art such as hematite. The p-type and n-type semiconductors 12, 14 are generally configured with electrical terminals 13, 15 that are electrically coupled to a load 18. In this example the load 18 is shown as a battery. It should be understood that a wide variety of loads may be used. A light source, e.g., sunlight, is generally directed at the photovoltaic device 10 as shown by arrow 11.

Figure 7B:
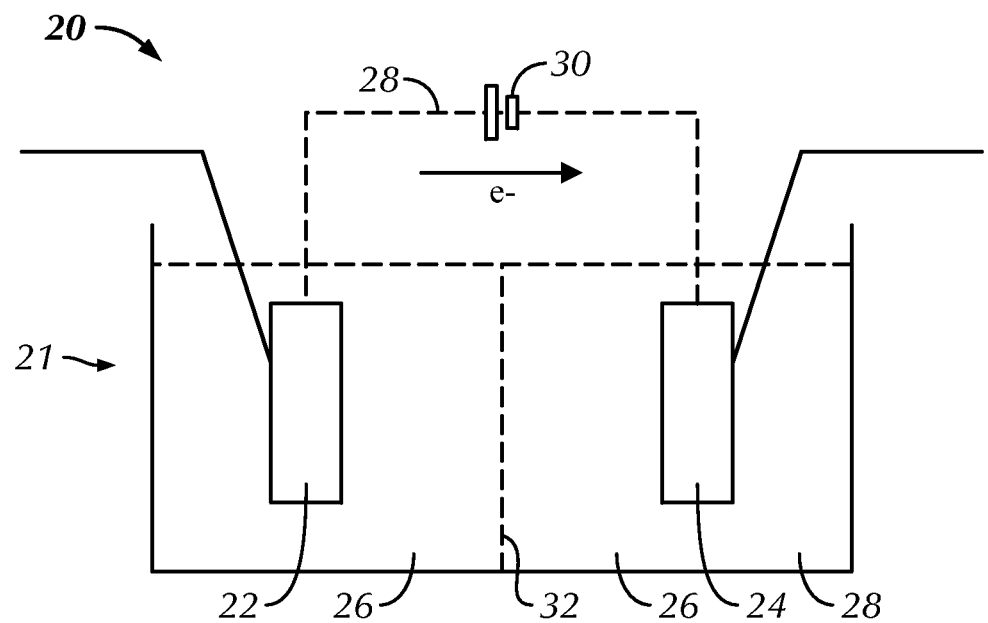
FIG. 7b is a block diagram of a photoelectrochemical cell including a photoelectrode constructed in accordance with the disclosure herein.

FIG. 7b is a block diagram of a photoelectrochemical cell 20 including a photoelectrode 24 constructed in accordance with the disclosure herein and a second electrode 22. It should be understood that the photoelectrochemical cell 20 may be constructed using conventional materials as is well known to those skilled in the art. The photoelectode 24 may function as a cathode. The photoelectrode 24 may be constructed using conventional techniques for reduction of various species (including water, carbon dioxide, formic acid, etc.) and generally includes FeO doped with lithium, hydrogen or sodium or alloyed with magnesium, manganese, zinc or nickel as disclosed above. The second electrode 22 may also be constructed using conventional materials. In a typical example, the second electrode 22 is constructed using hematite and/or other materials that are catalytic for water oxidation. In general, the photoelectrochemical cell 20 includes an electrolyte or aqueous solution 26 generally surrounding the photoelectrode 24 and second electrode 22. A light source, e.g., sunlight, is generally is directed at the photoelectrochemical cell 20 as shown by arrow 21. The photoelectode 24 and second electrode 22 are electrically connected as shown by reference number 28. The photoelectrochemical cell 20 may optionally include a voltage source 30 configured to oppose the overpotential. It should be understood that a variety of fabrication techniques may be used including the one described in the example reference: M. Gheisari et al., Journal of Magnetism and Magnetic Materials 320(21), 2618 (2008). The photoelectrochemical cell 20 may optionally include a barrier 32 that is configured to assist in the collection of gasses such as hydrogen.

Although features and elements are described above in particular combinations, each feature or element may be used alone without the other features and elements or in various combinations with or without other features and elements.

What is claimed is:

1. A photoelectrode comprising an electrode at least partially formed of an oxide comprising a cubic rocksalt crystal structure of FeO combined with at least one of lithium, hydrogen, sodium, magnesium, manganese, zinc, or nickel, wherein the band gap of the oxide is between and including 1.3 eV and 2.5 eV.

2. The photoelectrode of claim 1, wherein the electrode is combined with at least one of hydrogen, lithium, or sodium.

3. The photoelectrode of claim 1, wherein the electrode is alloyed with at least one of magnesium, and manganese, zinc, or nickel.

4. The photoelectrode of claim 2, wherein the electrode is combined with hydrogen, lithium, and sodium.

5. The photoelectrode of claim 3, wherein the electrode is alloyed with magnesium (II) oxide, manganese (II) oxide, zinc (II) oxide, or nickel (II) oxide.

6. The photoelectrode of claim 2, wherein lithium is configured such that the lithium will not trap holes.

7. The photoelectrode of claim 2, wherein the hydrogen is configured such that the hydrogen will not trap holes.

8. The photoelectrode of claim 2, wherein the sodium is configured such that the sodium will not trap holes.

* * * * *